(12) United States Patent
Kim et al.

(10) Patent No.: US 8,895,967 B2
(45) Date of Patent: Nov. 25, 2014

(54) ORGANIC ELECTROLUMINESCENT DISPLAY DEVICE

(71) Applicant: LG Display Co., Ltd., Seoul (KR)

(72) Inventors: Woo Chan Kim, Gyeonggi-do (KR); Byung Chul Ahn, Seoul (KR); Hong Ki Park, Gyeonggi-do (KR); Hyo Dae Bae, Gyeonggi-do (KR); Yoon Heung Tak, Gyeonggi-do (KR); Sung Goo Jung, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 87 days.

(21) Appl. No.: 13/660,417

(22) Filed: Oct. 25, 2012

(65) Prior Publication Data

US 2013/0105773 A1 May 2, 2013

(30) Foreign Application Priority Data

Oct. 27, 2011 (KR) .................. 10-2011-0110806
Oct. 27, 2011 (KR) .................. 10-2011-0110807
Oct. 27, 2011 (KR) .................. 10-2011-0110808

(51) Int. Cl.
| | | |
|---|---|---|
| H01L 29/08 | (2006.01) | |
| H01L 27/32 | (2006.01) | |
| H01L 51/00 | (2006.01) | |
| H01L 51/52 | (2006.01) | |

(52) U.S. Cl.
CPC ......... *H01L 27/3251* (2013.01); *H01L 27/3211* (2013.01); *H01L 51/5203* (2013.01); *H01L 51/0024* (2013.01); *H01L 27/322* (2013.01)
USPC ............................................. 257/40; 313/505

(58) Field of Classification Search
CPC .............. H01L 27/322; H01L 27/3211; H01L 51/5203; H01L 51/0024
USPC ............................................. 257/40; 313/505
See application file for complete search history.

(56) References Cited

U.S. PATENT DOCUMENTS

| | | | |
|---|---|---|---|
| 2004/0233139 A1* | 11/2004 | Asano et al. ..................... 345/76 |
| 2005/0007014 A1* | 1/2005 | Kurata ........................... 313/504 |
| 2005/0093435 A1* | 5/2005 | Suh et al. ........................ 313/504 |
| 2005/0225232 A1* | 10/2005 | Boroson et al. ................ 313/504 |
| 2008/0191979 A1* | 8/2008 | Nakane et al. .................... 345/87 |
| 2009/0115326 A1* | 5/2009 | Chan et al. ..................... 313/504 |
| 2009/0201229 A1* | 8/2009 | Kobayashi ....................... 345/76 |
| 2011/0108845 A1* | 5/2011 | Kwon et al. ...................... 257/72 |
| 2012/0018749 A1* | 1/2012 | Lee et al. .......................... 257/89 |
| 2012/0025699 A1* | 2/2012 | Okumoto et al. .............. 313/506 |

\* cited by examiner

*Primary Examiner* — Douglas Menz
(74) *Attorney, Agent, or Firm* — Morgan, Lewis & Bockius LLP

(57) ABSTRACT

An organic electroluminescent display device is disclosed which includes: a lower substrate including a first substrate defined into red, green and blue sub-pixel regions, first and second switching elements formed in the red and green sub-pixel regions, first and second anodes each connected to the first and second switching elements, and a first organic light emission layer entirely formed on the first substrate provided with the first and second anodes; and an upper substrate including a second substrate, red and green color filter layers formed on the second substrate corresponding to the red and green sub-pixel regions, a third switching element formed on the second substrate corresponding to the blue sub-pixel region, a third anode connected to the third switching element, and a second organic light emission layer entirely formed on the second substrate provided with the red and green color filter layers and the third anode.

9 Claims, 21 Drawing Sheets

<Surface Cleaning>

<Surface Cleaning>

<Surface Cleaning>

ORGANIC ELECTROLUMINESCENT DISPLAY DEVICE

The present application claims priority under 35 U.S.C. §119(a) of Korean Patent Application Nos. 10-2011-0110806, 10-2011-0110807, and 10-2011-0110808, filed on Oct. 27, 2011, which are hereby incorporated by reference in their entireties.

BACKGROUND

1. Field of the Disclosure

The present application relates to an organic electroluminescent display device.

2. Description of the Related Art

Recently, flat display device have been actively researched in order to enhance display quality and enlarge the screen size. Among the flat display device, organic electroluminescent display devices are self-illuminating display devices. In order to display images, the organic electroluminescent display devices display emit light by forming excitons images through the recombination of carriers such as an electron and an electric hole.

The organic electroluminescent display device can be used as a pixel of a graphic display system, an image display device of a television system, a surface light source, or others, because of having features such as a wide viewing angle, high speed response, a high contrast ratio and so on. Moreover, the organic electroluminescent display device with light weight, thin thickness and superior color vision is considered to be a next generation display device.

Also, the organic electroluminescent display device is classified into a passive matrix type and an active matrix type. An organic electroluminescent display device of the active matrix type includes thin film transistors, but an organic electroluminescent display device of the passive matrix type does not include any thin film transistor.

Such an organic electroluminescent display device includes organic light emission elements each formed in pixel regions. Each of the light emission elements includes an organic light emission layer which is interposed between an anode and a cathode and formed from an organic light emission material.

The organic light emission layer of the organic light emission element includes a plurality of functional layers, such as a hole injection layer, a hole transport layer, a light emission layer, an electron transport layer, an electron injection layer or others. The combination or arrangement of functional layers can enhance the light emission efficiency of the organic light emission element.

The above-mentioned organic light emission layer is ordinarily formed in the pixel region of the organic electroluminescent display device using a vacuum deposition process which allows an organic light emission material to be deposited on a substrate.

In the vacuum deposition process, an organic light emission material used to form the organic light emission layer is placed into a deposition source with an outlet. The deposition source is heated within a vacuum chamber and enables the organic light emission material to be vaporized and discharged through the outlet. As such, the vaporized organic light emission material can be discharged from the deposition source and deposited on the substrate.

If the organic electroluminescent display device including a plurality of organic light emission layers with desired patterns is fabricated, the deposition process is performed using a shadow mask having a plurality of openings. More specifically, the shadow mask is positioned closely to the substrate. Then, the vaporized organic light emission material is deposited on the substrate through the shadow mask. Therefore, the organic light emission layer having a plurality of desired patterns which are separated from one another can be formed on the substrate.

FIG. 1 is a view illustrating an ordinary process of forming an organic light emission layer of the organic electroluminescent display device. As shown in FIG. 1, the organic electroluminescent display device includes red, green and blue organic light emission layers R, G and B which are formed in an active area. The red, green and blue organic light emission layers are formed on the substrate 10 by heating a boat into which the organic light emission material is filled.

More specifically, when a substrate 10 in which organic light emission layers will be formed is loaded into a chamber, a shadow mask 30 placed on a mask frame 15 is aligned with the substrate 10. Then, boats 20 holding red, green and blue organic light emission materials are sequentially heated. As such, the red, green and blue organic light emission layers R, G and B are sequentially formed on the substrate 10. As the boats 20 are sequentially heated, shadow masks each opposite to red, green and blue sub-pixels are replaced alternately with one another in order to form the red, green and blue organic light emission layers R, G and B in red, green and blue sub-pixel regions.

However, when the shadow masks 30 are used in the formation of the organic light emission layers, the organic light emission materials cannot be uniformly deposited on the substrate 10. To address this matter, the distance between the shadow mask 30 and the boat 20 can increase. In this case, the organic light emission layer can be polluted by other materials and moved apart from a desired formation position due to the contact of the shadow mask 30 with the substrate 10.

Moreover, a large sized organic electroluminescent display device forces the size of the shadow mask to become larger. The enlarged shadow mask can be bent with its central portion in the center. Due to this, it is difficult to accurately form the organic light emission layer.

BRIEF SUMMARY

Accordingly, embodiments of the present application are directed to an organic electroluminescent display device that substantially obviates one or more of problems due to the limitations and disadvantages of the related art, as well as a method of fabricating the same.

The embodiments are to provide an organic electroluminescent display device and a fabricating method thereof that are adapted to realize large size and high definition by distributing organic light emission layers to two substrates.

Also, the embodiments are to provide an organic electroluminescent display device and a fabricating method thereof that are adapted to prevent the deterioration of productivity ratio due to the generation of different materials by entirely coating an organic light emission layer on a substrate without using any shadow mask.

Moreover, the embodiments are to provide an organic electroluminescent display device and a fabricating method thereof that are adapted to realize large size and high definition by distributing first and second organic light emission layers to red and green sub-pixel regions and blue sub-pixel region and outputting red light, green light and blue light using only red and blue color filter layers.

Furthermore, the embodiments are to provide an organic electroluminescent display device and a fabricating method thereof that are adapted to realize large size and high definition by forming an organic light emission layer in red and green sub-pixel regions using one of an ink-jet printing method and a nozzle-jet printing method.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to a first general aspect of the present embodiment, an organic electroluminescent display device includes: a lower substrate including a first substrate defined into red, green and blue sub-pixel regions, first and second switching elements formed in the red and green sub-pixel regions, first and second anodes each connected to the first and second switching elements, and a first organic light emission layer entirely formed on the first substrate provided with the first and second anodes; and an upper substrate including a second substrate, red and green color filter layers formed on the second substrate corresponding to the red and green sub-pixel regions, a third switching element formed on the second substrate corresponding to the blue sub-pixel region, a third anode connected to the third switching element, and a second organic light emission layer entirely formed on the second substrate provided with the red and green color filter layers and the third anode.

An organic electroluminescent display device according to a second general aspect of the present embodiment includes: first through third switching elements formed in red, green and blue sub-pixel regions into which a substrate is defined, respectively; a passivation layer entirely formed on the substrate which is provided with the first through third switching elements; red and green color filter layers formed on the passivation layer corresponding to the red and green sub-pixel regions; first and third anodes formed in the red, green and blue sub-pixel regions, respectively; an organic light emission layer pattern formed on the substrate which is provided with the first through third anodes; a first cathode formed on the organic light emission layer pattern; an organic light emission layer formed on the substrate which is provided with the first cathode; and a second cathode formed on the organic light emission layer.

An organic electroluminescent display device according to a third general aspect of the present embodiment includes first through third switching elements formed in red, green and blue sub-pixel regions into which a substrate is defined, respectively; a passivation layer entirely formed on the substrate which is provided with the first through third switching elements; red and green color filter layers formed on the passivation layer corresponding to the red and green sub-pixel regions; first and third anodes formed in the red, green and blue sub-pixel regions, respectively; a hole support layer formed on the substrate which is provided with the first through third anodes; a first organic light emission layer formed on the hole support layer corresponding to the red and green sub-pixel regions; a second organic light emission layer formed on the substrate which is provided with the first organic light emission layer; an electron support layer formed on the second organic light emission layer; and a cathode formed on the electron support layer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings

DETAILED DESCRIPTION OF THE EMBODIMENTS

Figure 1:
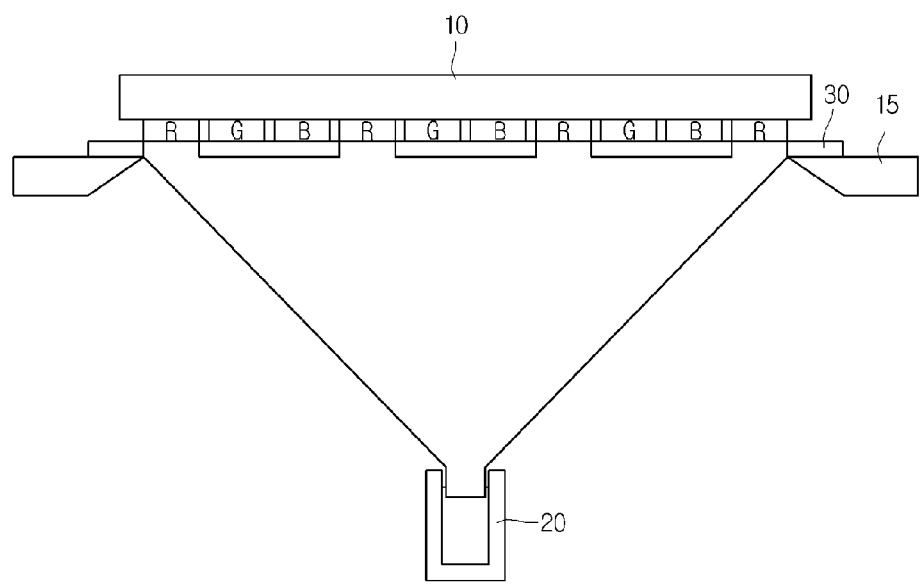
FIG. 1 is a view illustrating an ordinary process of forming an organic light emission layer of the organic electroluminescent display device.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

FIGS. 2A through 2G are cross-sectional views illustrating a method of fabricating an organic electroluminescent display device according to a first embodiment of the present disclosure.

Referring to FIGS. 2A through 2G, a first substrate 100 is prepared. Although they are not shown in the drawings, a plurality of gate lines and a plurality of data lines crossing each other are formed on the first substrate 100 in such a manner as to define a plurality of sub-pixel regions. Also, thin film transistors TFT are formed in only red and green sub-pixel regions among the sub-pixel regions, as switching elements. In other words, the organic electroluminescent display device of the first embodiment enables the switching elements to be distributed to both sides of the first substrate 100 and a second substrate 200 which will be described as an upper substrate later. In detail, the switching elements used for the red and green sub-pixels are formed on the red and green sub-pixel regions of the first substrate 100, but the switching elements used for blue sub-pixels are formed on the second substrate 200.

In the present disclosure, the organic electroluminescent display device including pixels each configured with the red, green and blue sub-pixels will be mainly described.

As shown in the drawings, a first switching element T1 and a second switching element T2 are formed on the red and green sub-pixel regions of the first substrate 100, respectively. A passivation layer 101 is formed on the entire surface of the first substrate 100 provided with the first and second switching elements T1 and T2.

Although the structure of each switching element T1 and T2 is not shown in the drawings, one of a top-gate thin-film transistor and a bottom-gate thin-film transistor, which are generally being used in the organic electroluminescent display devices, can be formed as a switching element.

After the above-mentioned passivation layer 101 is formed on the first substrate 100, a contact hole formation process is performed for the passivation layer 101 and then a first bank pattern 103 used for separating the sub-pixels from one another is formed on the passivation layer 101. The contact hole formation process allows drain electrodes of the first and second switching elements T1 and T2. The first bank pattern 103 can be prepared by forming an organic film on the entire surface of the first substrate 100 with the contact holes and performing a photolithography procedure, which includes a masking process, for the organic film.

Thereafter, first and second anodes 120a and 120b are formed in the red and green sub-pixel regions R and G of the first substrate 100. The first and second anodes 120a and 120b can be prepared by forming a metal film on the entire surface of the first substrate 10 provided with the first bank pattern 103 and performing a masking process and an etch process for the metal film. The metal film can be formed from one of magnesium Mg, calcium Ca, aluminum Al, silver Ag, lithium Li and alloys thereof.

Alternatively, the first and second anodes 120a and 120b can be formed before the first bank pattern 103 used to separate the sub-pixels from one another, after the passivation layer 101 is formed on the first substrate 100 and the contact hole formation process is performed for the passivation layer 101.

Figure 2A:
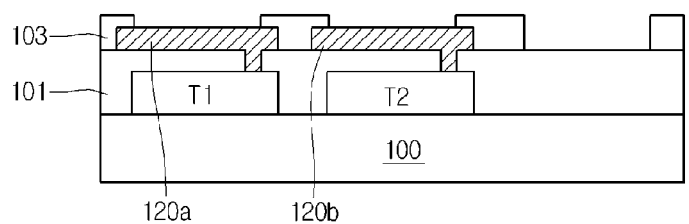
FIGS. 2A through 2G are cross-sectional views illustrating a method of fabricating an organic electroluminescent display device according to a first embodiment of the present disclosure.
Figure 2B:
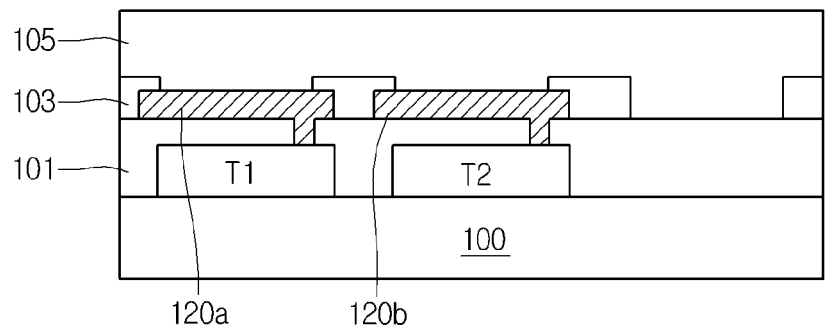
Figure 2C:
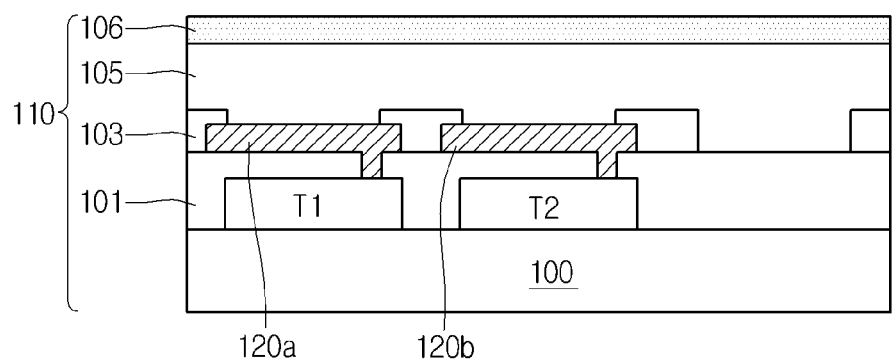

Subsequently, as shown in FIGS. 2B and 2C, an organic light emission layer 105 and a first cathode 106 are sequentially formed on the first substrate 100 so that the fabrication of a lower substrate 110 for the organic electroluminescent display device is completed. The first cathode 106 can be formed from a transparent conductive material such as indium-tin-oxide ITO, indium-zinc-oxide IZO or aluminum-zinc-oxide AZO. The first organic light emission layer 105 can be formed from an organic material adapted to emit a mixture of red light and green light.

Figure 2D:
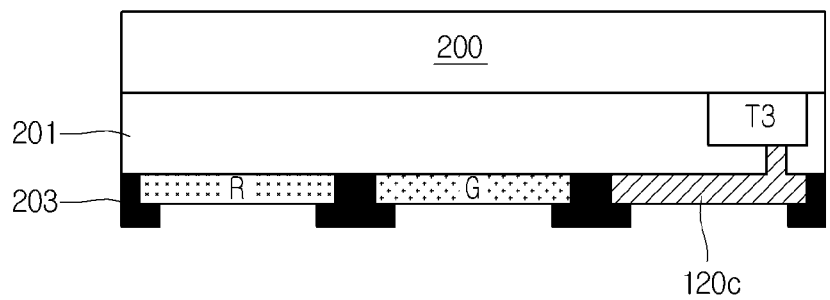

When the lower substrate 110 of the organic electroluminescent display device is completely fabricated as described above, the third switching element T3 is formed in the blue sub-pixel region B of the second substrate 200 and an insulation layer 201 is formed on the entire surface of the second substrate 200 provided with the third switching element T3, as shown in FIG. 2D. The third switching element T3 is formed in the same structure as the first and second switching elements T1 and T2. Also, the third switching element T3 has the same function as the first and second switching elements T1 and T2.

In other words, the first through third switching elements T1 through T3 are formed in the red, green and blue sub-pixel regions R, G and B, respectively, but distributed to the first and second substrates 100 and 200. In detail, the first and second switching elements T1 and T2 each opposite to the red and blue sub-pixels are formed on the first substrate 100 of the lower substrate 110, but the third switching element T3 opposite to the blue sub-pixel is formed on the second substrate 200 of the upper substrate 210.

The insulation layer 201 can become a planarization layer. Also, the insulation layer 201 can be formed in a multilayered structure.

After the third switching element T3 and the insulation layer 201 are formed on the second substrate 200, a second bank pattern 203 defining the sub-pixel regions is formed on the second substrate 200. The second bank pattern 203 can be prepared by forming a metal film or an opaque resin layer on the insulation layer 201 and performing a masking process for the metal film or the opaque resin layer. The metal film used in the formation of the second bank pattern 203 can be formed a metal material such as chromium Cr.

When the second bank pattern 203 is formed on the second substrate 200 as described above, a red color filter layer R and a green color filter layer G are formed in red and green sub-pixel regions of the exposed insulation layer 201 opposite to the first and second anodes of the first substrate 100, respectively.

Also, a third anode 120c is formed in a blue sub-pixel region B of the exposed insulation layer 201. The third anode 120c can be prepared by forming a transparent conductive material film on the second substrate 200 provided with the red and green color filter layers R and G and performing another masking process for the transparent conductive material film. In other words, the third anode 120c can be formed from a transparent conductive material such as indium-tin-oxide ITO, indium-zinc-oxide IZO or aluminum-zinc-oxide AZO, unlike the first and second anodes on the first substrate 100.

Alternatively, the red and green color filter layers R and G and the third anode 120c can be formed on the insulation layer 201 before the formation of the second bank pattern 203.

Figure 2E:
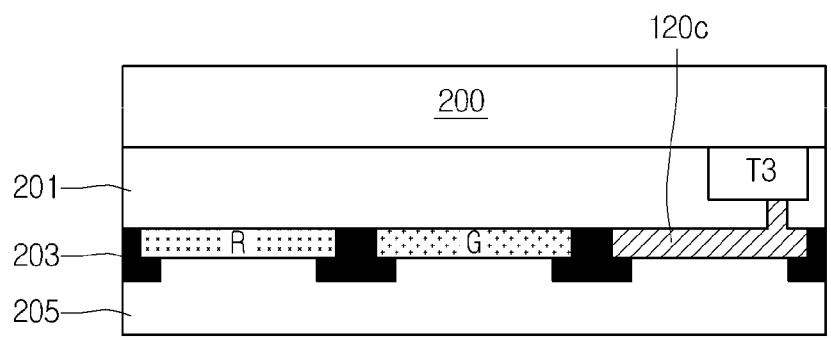
Figure 2F:
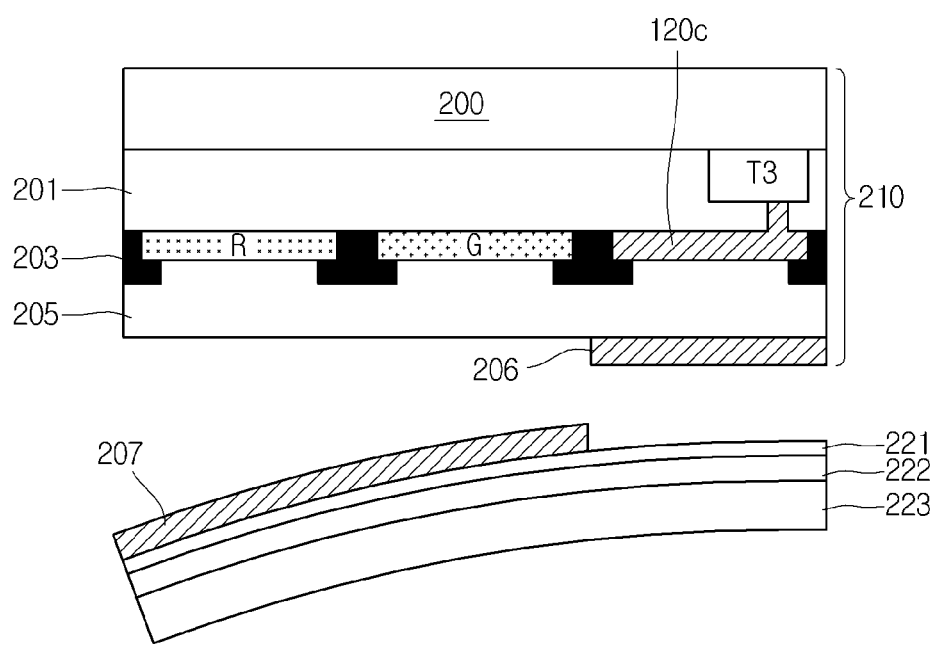

After the red and green color filter layers R and G and the third anode 120c are formed on the second substrate 200, a second organic light emission layer 205 is formed on the entire surface of the second substrate 200, as shown in FIG. 2E. The second organic light emission layer 205 is formed from an organic material adapted to emit blue light, unlike the first organic light emission layer 105.

Thereafter, a second cathode 206 is formed on the second organic light emission layer 205 of the second substrate 200 so that the fabrication of an upper substrate 210 of the organic electroluminescent display device is completed. The second cathode 206 is formed on a part of the second organic light emission layer 205 corresponding to the blue sub-pixel region in which the red and green color filter layers R and G are not formed.

In order to form the second cathode 206, an electrode film including a light-to-heat conversion layer 222, a buffer layer 221 and a metal layer, which are stacked on a base substrate 223, is attached to the second organic light emission layer 205, and laser light is irradiated a part of the electrode film corresponding to the region in which the second cathode 206 will be formed. When laser light is irradiated on a part of the electrode film, the light-to-heat conversion layer 222 generates high-temperature heat and forces a part of the metal layer on the buffer layer 221 to be attached to the second organic light emission layer 205. In accordance therewith, the second cathode 206 is formed on the second organic light emission layer corresponding to the blue sub-pixel region. Although it is shown in the drawing, a reference number "207" not cited in the above description indicates a sacrificial layer. The sacrificial layer 207 corresponds to the residual metal layer which remains on the electrode film after the formation of the second cathode 206.

The second cathode 206 can be formed from an opaque metal with a high reflectance, unlike the first cathode 106. This results in that blue light generated in the second organic light emission layer 205 is reflected by the second cathode 206 and is output toward the rear surface of the second substrate 200 through third anode 120c.

Figure 2G:
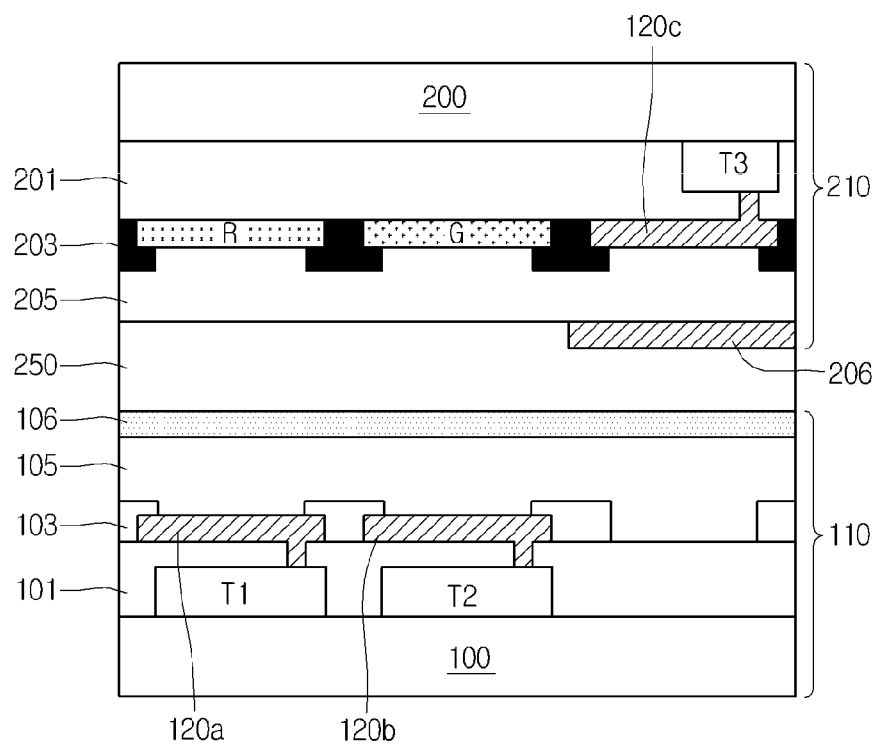

When the fabrication of the upper substrate 210 including the red and green color filter layers R and G and the third switching element T3 in the blue sub-pixel region is completed, as shown in FIG. 2G, the upper substrate 210 and the lower substrate 110 are combined with each other by means of an adhesive layer 250. As such, a completed organic electroluminescent display device is produced.

The organic electroluminescent display device according to a first embodiment of the present disclosure allows not only the red and green color filter layers R and G to be formed in the red and green sub-pixel regions, respectively, but also the second organic light emission layer 205 emitting blue light to be formed in the blue sub-pixel region. In other words, a blue color filter layer is not formed in the blue sub-pixel region.

Also, the first and second organic light emission layers 105 and 205 can be formed on the first and second substrates 100 and 200 through the coating process or the deposition process and without using any shadow mask. As such, the organic electroluminescent display device of the first embodiment can prevent the previous problems which had been generated in that of the related art due to the use of the shadow mask.

In the red sub-pixel region, the mixture of red light and green light generated in the first organic light emission layer 105 is re-mixed with blue light generated in the second organic light emission layer 205. As such, the re-mixed light can pass through the red color filter layer R. Therefore, red light can be output from the red sub-pixel. Similarly to this, green light can be output from the green sub-pixel. Meanwhile, in the blue sub-pixel region, only blue light generated in the second organic light emission layer 205 can be output through the third anode 120c. In this manner, the organic electroluminescent display device of the first embodiment can enable red, green and blue lights to be output from the red, green and blue sub-pixel, thereby displaying a color image.

The organic electroluminescent display device and the fabricating method thereof according to the present embodiment allow the organic light emission layer to be distributed to the two substrates and formed through only the coating process or the deposition process. As such, a large-sized screen and a high-definition image can be provided.

Moreover, the organic electroluminescent display device and the fabricating method thereof according to the present embodiment enable the organic light emission layer to be formed without using any shadow mask. In accordance therewith, the deterioration of productivity ratio due to the generation of different materials can be prevented.

FIGS. 3A through 3G are cross-sectional views illustrating a method of fabricating an organic electroluminescent display device according to a second embodiment of the present disclosure.

The description of the second embodiment will be focused on components of the second embodiment which are distinguished from those of the first embodiment. Also, it will be easily understood to an ordinary person explanation regarding the other components of the second embodiment, which will be not explained in detail, upon the above-mentioned description of the first embodiment.

As shown in FIGS. 3A through 3G, a first switching element T1 and a second switching element T2 are formed on red and green sub-pixel regions of the first substrate 100, respectively. A passivation layer 101 is formed on the entire surface of the first substrate 100 provided with the first and second switching elements T1 and T2.

Subsequently, a first bank pattern 103 is formed on the passivation layer 101. Also, first and second anodes 120a and 120b are formed in the red and green sub-pixel regions of the passivation layer 101.

Figure 3A:
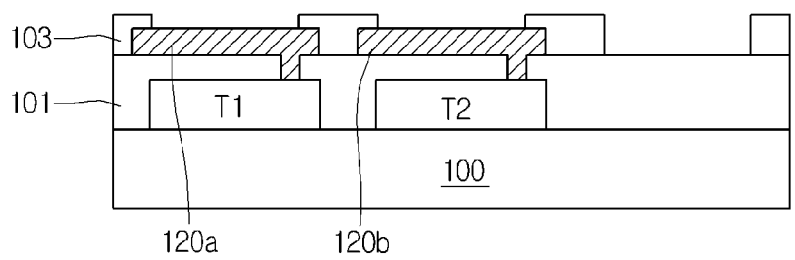
FIGS. 3A through 3G are cross-sectional views illustrating a method of fabricating an organic electroluminescent display device according to a second embodiment of the present disclosure.
Figure 3B:
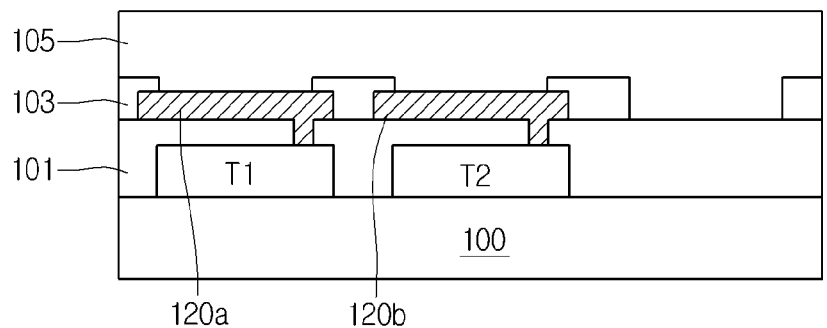
Figure 3C:
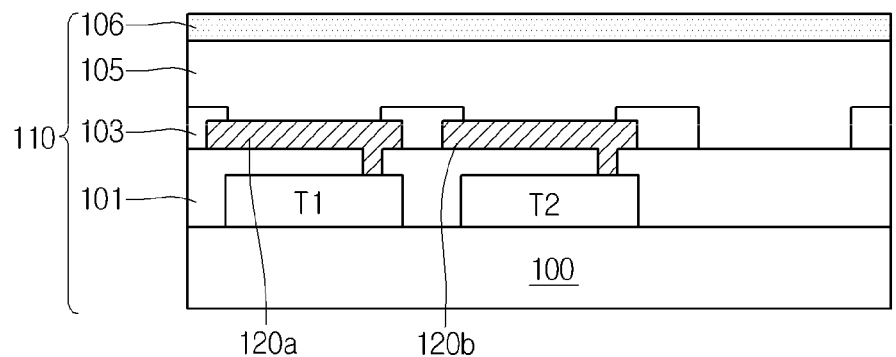

Afterward, as shown in FIGS. 3B and 3C, an organic light emission layer 105 and a first cathode 106 are sequentially formed on the first substrate 100 so that the fabrication of a lower substrate 110 for the organic electroluminescent display device is completed. The first cathode 106 can be formed from a transparent conductive material such as indium-tin-oxide ITO, indium-zinc-oxide IZO or aluminum-zinc-oxide AZO. The first organic light emission layer 105 can be formed from an organic material adapted to emit a mixture of red light and green light.

Figure 3D:
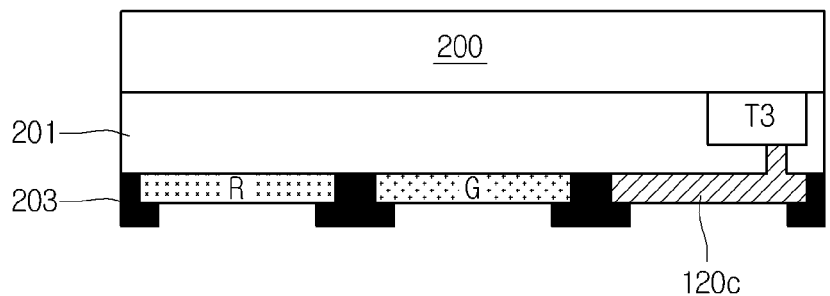
Figure 3E:
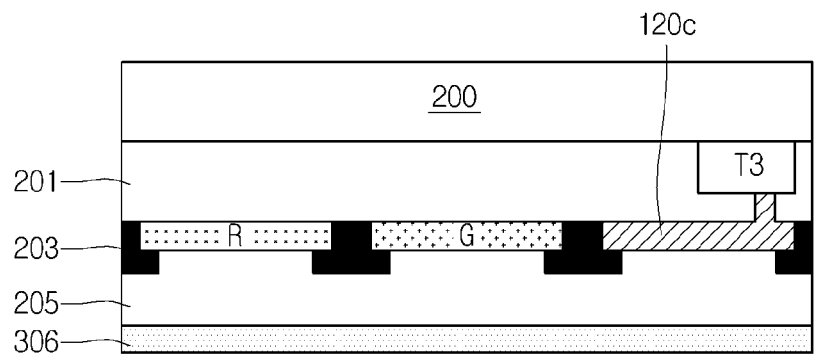

When the lower substrate 110 of the organic electroluminescent display device is completely fabricated as described above, a third switching element T, an insulation layer 201, a second bank pattern defining a plurality of sub-pixel regions, red and green color filter layers R and G, and a third anode 120c are sequentially formed on a second substrate 200, as shown in FIGS. 3D and 3E.

The third anode 120c can be formed from a transparent conductive material such as indium-tin-oxide ITO, indium-zinc-oxide IZO or aluminum-zinc-oxide AZO, unlike the first and second anodes 120a and 120b on the first substrate 100.

Figure 3F:
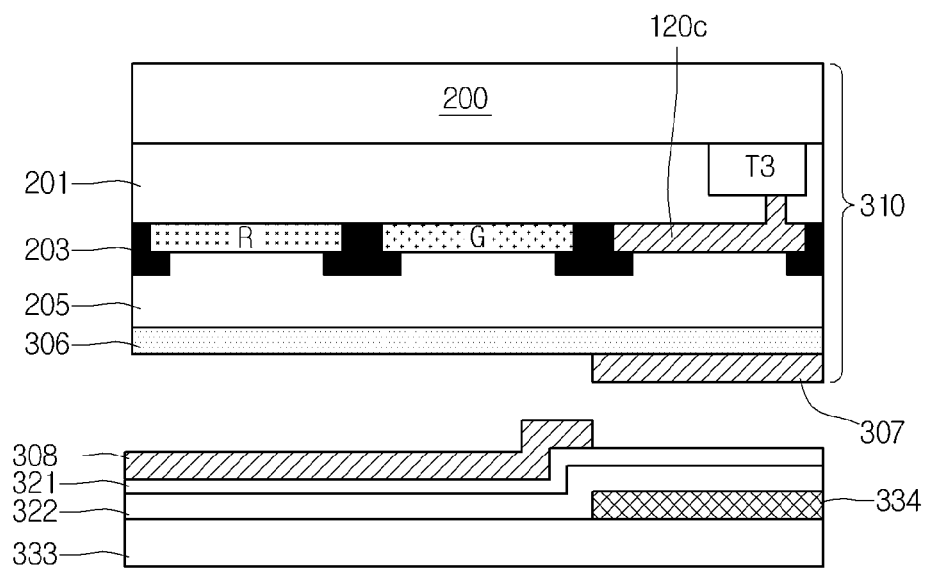
Figure 3G:
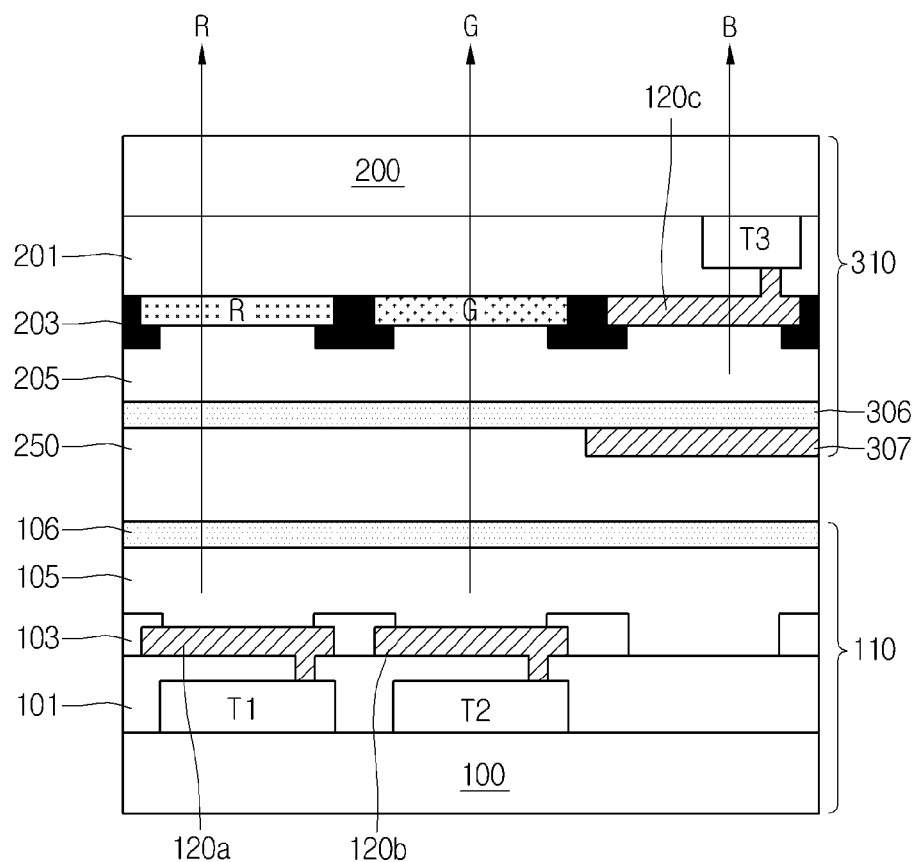

After the red and green color filter layers R and G and the third anode 120c are formed on the second substrate 200, a second organic light emission layer 205 and a second cathode 306 are sequentially formed on the entire surface of the second substrate 200, as shown in FIGS. 3F and 3G. The second cathode 306 can be formed from the same transparent conductive material as the first cathode 106.

Thereafter, a reflective plate 307 is formed on the second cathode 306 corresponding to the blue sub-pixel region, thereby completing the fabrication of an upper substrate 310.

In order to form the reflective plate 307, a metal film including a heat emission layer 334, first and second buffer layers 322 and 321 and a metal layer, which are stacked on a base substrate 333, is attached to the second cathode 306. Also, either laser light is irradiated on a part of the metal film corresponding to the region in which the reflective plate 307 will be formed, or a high voltage is applied to a part of the heat emission layer 334 corresponding to the blue sub-pixel region.

The heat emission layer 334 can be formed from a metal, such as molybdenum Mo, with superior heat absorptivity. Also, the heat emission layer is patterned and disposed on the base substrate 333 corresponding to the blue sub-pixel region.

When either laser light is irradiated or the high voltage is applied, the heat emission layer 334 generates high-temperature heat and forces a part of the metal layer on the second buffer layer 321 to be attached to the second cathode 306. In accordance therewith, the reflective plate 307 is formed on the second cathode 306 corresponding to the blue sub-pixel region. Although it is shown in the drawing, a reference number "308" not cited in the above description indicates a sacrificial layer. The sacrificial layer 308 corresponds to the residual metal layer which remains on the metal film after the formation of the reflective plate 307.

The reflective plate 307 reflects blue light, which is generated in the second organic light emission layer 205 and entered through the second cathode 306, toward the rear surface of the second substrate 200.

When the fabrication of the upper substrate 310 including the red and green color filter layers R and G and the third switching element T3 in the blue sub-pixel region is completed, as shown in FIG. 3G, the upper substrate 310 and the lower substrate 110 are combined with each other by means of an adhesive layer 250. As such, a completed organic electroluminescent display device is produced.

The organic electroluminescent display device according to a second embodiment of the present disclosure allows not only the red and green color filter layers R and G to be formed in the red and green sub-pixel regions, respectively, but also the second organic light emission layer 205 emitting blue light to be formed in the blue sub-pixel region. In other words, a blue color filter layer is not formed in the blue sub-pixel region.

Also, the first and second organic light emission layers 105 and 205 can be formed on the first and second substrates 100 and 200 through the coating process or the deposition process and without using any shadow mask. As such, the organic electroluminescent display device of the second embodiment can prevent the previous problems which had been generated in that of the related art due to the use of the shadow mask.

In the red sub-pixel region, the mixture of red light and green light generated in the first organic light emission layer 105 is re-mixed with blue light generated in the second organic light emission layer 205. As such, the re-mixed light can be applied to the red color filter layer R. Therefore, red light can be output from the red sub-pixel. Similarly to this, green light can be output from the green sub-pixel. Meanwhile, in the blue sub-pixel region, only blue light generated in the second organic light emission layer 205 can be output through the third anode 120c.

The organic electroluminescent display device and the fabricating method thereof according to the present embodiment allow the organic light emission layer to be not only distributed to the two substrates but also formed through only the coating process or the deposition process without using any shadow mask. As such, a large-sized screen and a high-definition image can be provided.

Moreover, the organic electroluminescent display device and the fabricating method thereof according to the present embodiment enable the organic light emission layer to be formed without using any shadow mask. In accordance therewith, the deterioration of productivity ratio due to the generation of different materials can be prevented.

FIGS. 4A through 4F are cross-sectional views illustrating a method of fabricating an organic electroluminescent display device according to a third embodiment of the present disclosure.

In this disclosure, components of the third embodiment which are distinguished from those of the first and second embodiments will be mainly described. Also, it will be easily understood to an ordinary person explanation regarding the other components of the third embodiment, which will be not explained in detail, upon the above-mentioned descriptions of the first and second embodiments.

As shown in FIGS. 4A through 4F, a first switching element T1 and a second switching element T2 are formed on the red and green sub-pixel regions of the first substrate 100, respectively. A passivation layer 101 is formed on the entire surface of the first substrate 100 provided with the first and second switching elements T1 and T2.

Subsequently, a first bank pattern 103, first and second anodes 120a and 120b and a reflective plate 407 are formed on the passivation layer 101. The first and second anodes 120a and 120b are formed on regions of the passivation layer 101 opposite to red and green sub-pixels, respectively. The reflective plate 407 is formed on another region of the passivation layer 101 opposite to a blue sub-pixel. The first and second anodes 120a and 120b and the reflective plate 407 can be simultaneously formed.

However, the first and second anodes 120a and 120b and the reflective plate 407 can be formed before the first bank pattern 103 used to separate the sub-pixels from one another, after the passivation layer 101 is formed on the first substrate 100 and a contact hole formation process is performed for the passivation layer 101.

Figure 4A:
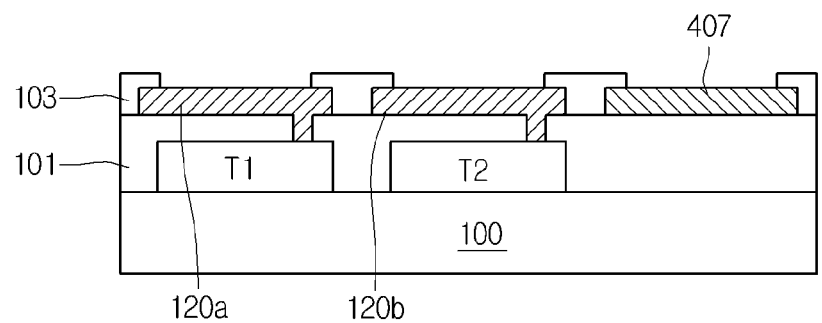
FIGS. 4A through 4F are cross-sectional views illustrating a method of fabricating an organic electroluminescent display device according to a third embodiment of the present disclosure.
Figure 4B:
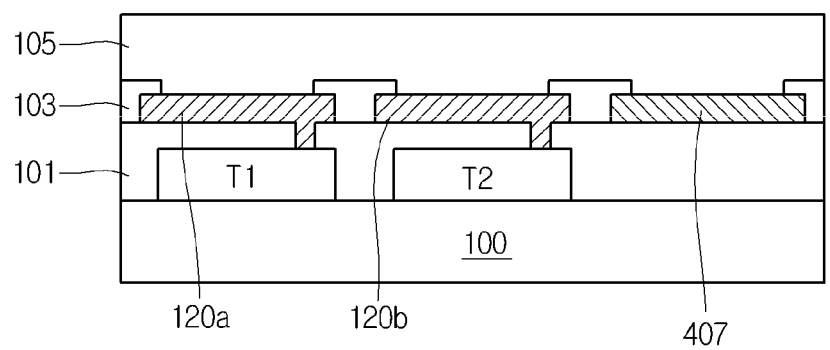
Figure 4C:
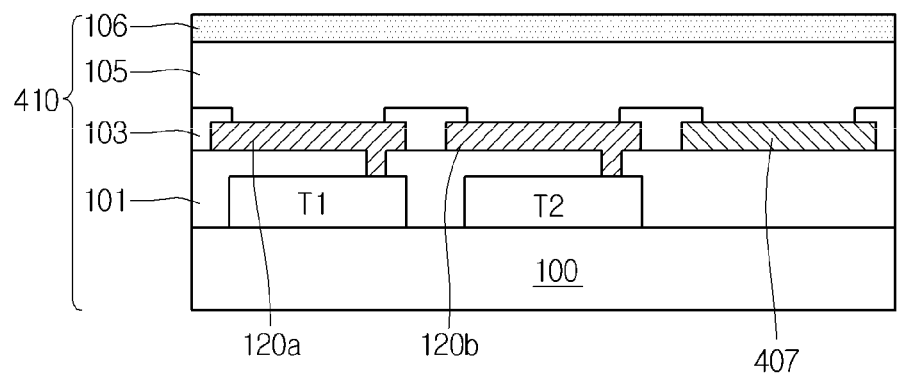

Thereafter, as shown in FIGS. 4B and 4C, a first organic light emission layer 105 and a first cathode 106 are sequentially formed on the first substrate 100 so that the fabrication of a lower substrate 410 for the organic electroluminescent display device is completed. The first cathode 106 can be formed from a transparent conductive material. The first organic light emission layer 105 can be formed from an organic material adapted to emit a mixture of red light and green light.

Figure 4D:
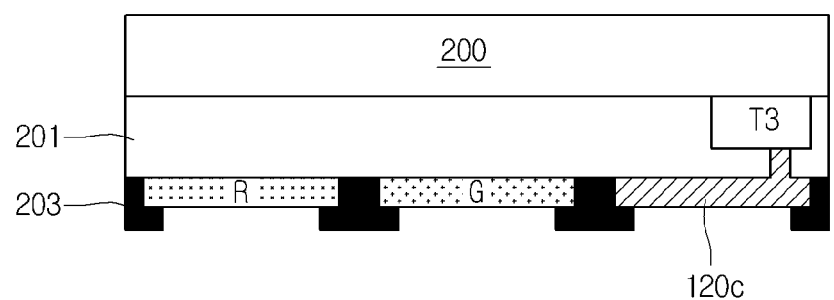

When the lower substrate 410 of the organic electroluminescent display device is completely fabricated as described above, a third switching element T3, an insulation layer 201, a second bank pattern 203 defining a plurality of sub-pixel regions, red and green color filter layers R and G, and a third anode 120c are sequentially formed on a second substrate 200, as shown in FIG. 4D.

The third anode 120c is disposed in the blue sub-pixel region. Also, the third anode 120c can be formed from a transparent conductive material such as indium-tin-oxide ITO, indium-zinc-oxide IZO or aluminum-zinc-oxide AZO, unlike the first and second anodes 120a and 120b on the first substrate 100.

Figure 4E:
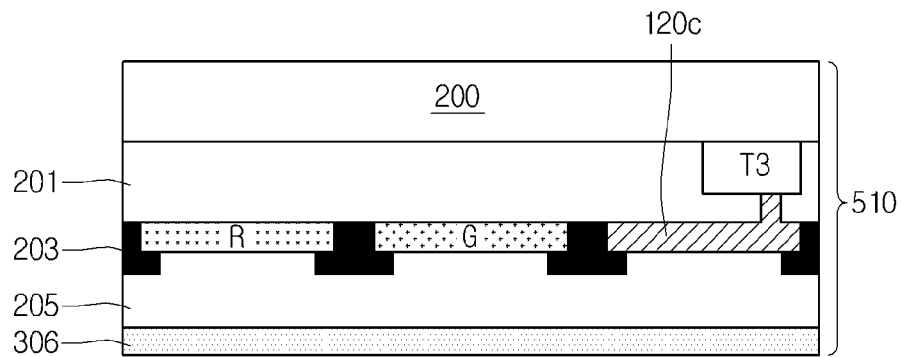

After the red and green color filter layers R and G and the third anode 120c are formed on the second substrate 200, a second organic light emission layer 205 used to emit blue light and a second cathode 306 are sequentially formed on the entire surface of the second substrate 200, as shown in FIG. 4E. In accordance therewith, the fabrication of an upper substrate 510 is completed. The second cathode 306 can be formed from the same transparent conductive material as the first cathode 106.

Figure 4F:
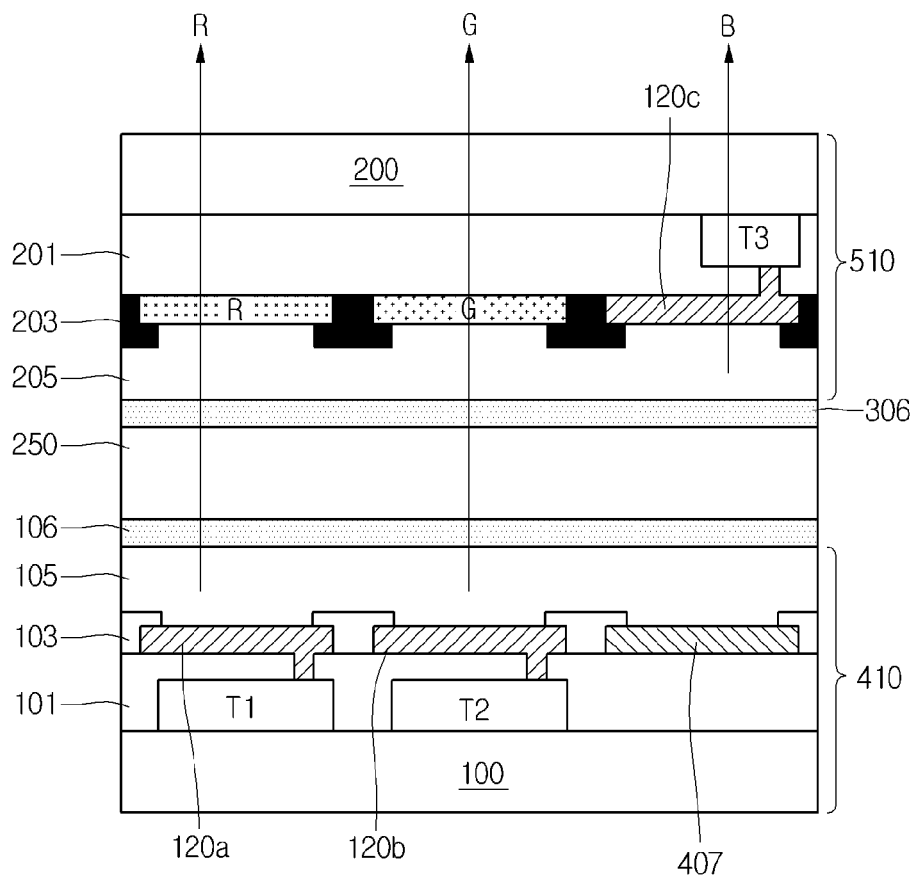

When the fabrication of the upper substrate 510 including the red and green color filter layers R and G and the third switching element T3 in the blue sub-pixel region is completed, as shown in FIG. 4F, the upper substrate 510 and the lower substrate 410 are combined with each other by means of an adhesive layer 250. As such, a completed organic electroluminescent display device is produced.

The organic electroluminescent display device according to a third embodiment of the present disclosure allows not only the red and green color filter layers R and G to be formed in the red and green sub-pixel regions, respectively, but also the second organic light emission layer 205 emitting blue light to be formed in the blue sub-pixel region. In other words, a blue color filter layer is not formed in the blue sub-pixel region.

Also, the first and second organic light emission layers 105 and 205 can be formed on the first and second substrates 100 and 200 through the coating process or the deposition process and without using any shadow mask. As such, the organic electroluminescent display device of the third embodiment can prevent the previous problems which had been generated in that of the related art due to the use of the shadow mask.

FIGS. 5A through 5E are cross-sectional views illustrating a method of fabricating an organic electroluminescent display device according to a fourth embodiment of the present disclosure.

As shown in FIGS. 5A through 5E, a first switching element T1, a second switching element T2 and a third switching element T3 are formed on red, green and blue sub-pixel regions of a substrate 400, respectively. A passivation layer 401 is formed on the entire surface of the substrate 400 provided with the first through third switching elements T1 through T3.

Although the structure of each switching element T1 through T3 is not shown in the drawings, one of a top-gate thin-film transistor and a bottom-gate thin-film transistor, which are generally being used in the organic electroluminescent display devices, can be formed as a switching element.

After the above-mentioned passivation layer 401 is formed on the substrate 400, a bank pattern 403 used to define sub-pixels is formed on the passivation layer 401. The bank pattern 403 can be prepared by forming a metal film or an opaque resin layer on the entire surface of the substrate 400 and performing a masking process for the metal film or the opaque resin layer. The metal film can be from a metal material such as chromium Cr.

When the bank pattern 403 is formed on the substrate 400 as described above, a red color filter layer R and a green color filter layer G are formed in exposed regions of the passivation layer 401 corresponding to the red and green sub-pixel regions, respectively. Subsequently, a contact hole formation process is performed for the red and green color filter layers R and G and the bank pattern 403, in order to expose drain electrodes of the first through third switching elements T1 through T3.

Thereafter, first through third anodes 420a through 420c are formed in the red, green and blue sub-pixel regions R, G and B of the substrate 400. The first through third anodes 420a through 420c can be prepared by forming a metal film on the entire surface of the substrate 400 provided with the bank pattern 403 and the red and green color filter layers R and G and performing a masking process and an etch process for the metal film. The metal film can be formed from a transparent conductive material such as indium-tin-oxide ITO, indium-zinc-oxide IZO or aluminum-zinc-oxide AZO.

Subsequently, a first organic light emission layer 405 is formed on the entire surface of the substrate 400 provided with the first through third anodes 420a through 420c using one of a coating process and a deposition process. Also, a metal layer 406 is formed on the first organic light emission layer 405. A laser irradiation process or an etch process is performed for a part of the metal layer 406 corresponding to the blue sub-pixel region so that apart of the metal layer corresponding to the blue sub-pixel region is removed. In accordance therewith, a first cathode 406a is formed on the first organic light emission layer 405 corresponding to the red and green sub-pixel regions. In other words, the first cathode 406a exposes the first organic light emission layer corresponding to the blue sub-pixel region. The metal layer 406 can be formed from one of magnesium Mg, calcium Ca, aluminum Al, silver Ag, lithium Li and alloys thereof.

After the formation of the first cathode 406a, the laser irradiation process is re-performed for the exposed portion of the first organic light emission layer 405 corresponding to the blue sub-pixel region, in order to remove the exposed portion of the first organic light emission layer 405. In accordance therewith, an organic light emission layer pattern 405a is derived from the first organic light emission layer 405. The first organic light emission layer 405 can be formed from an organic material capable of emitting a mixture of red light and green light. The organic light emission layer pattern 405a is formed only in the red and green sub-pixel regions.

Figure 5A:
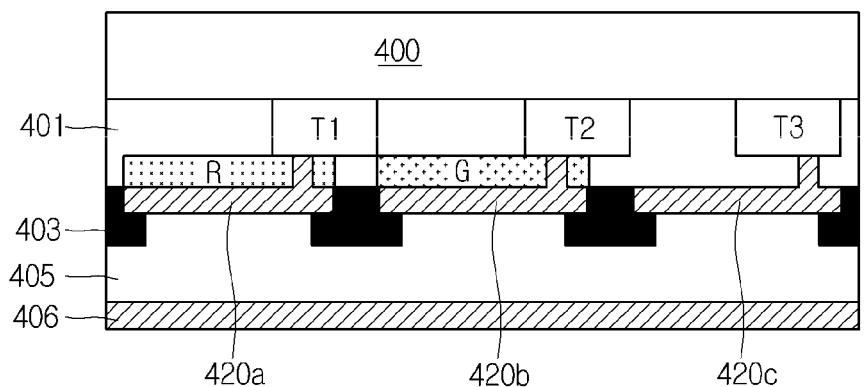
FIGS. 5A through 5E are cross-sectional views illustrating a method of fabricating an organic electroluminescent display device according to a fourth embodiment of the present disclosure.
Figure 5B:
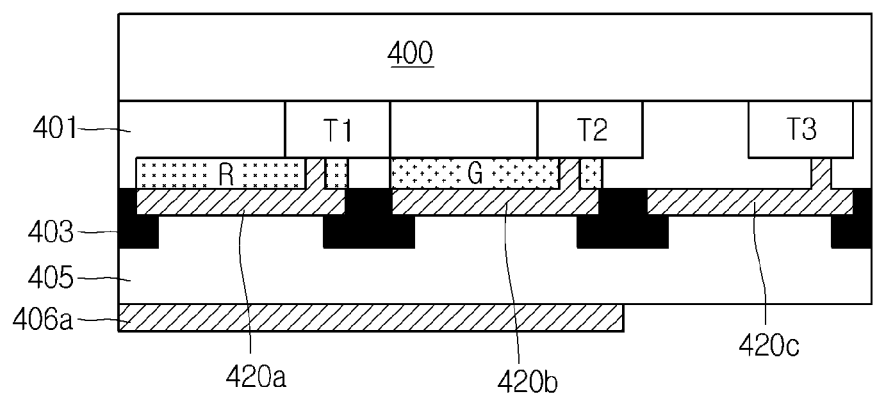
Figure 5C:
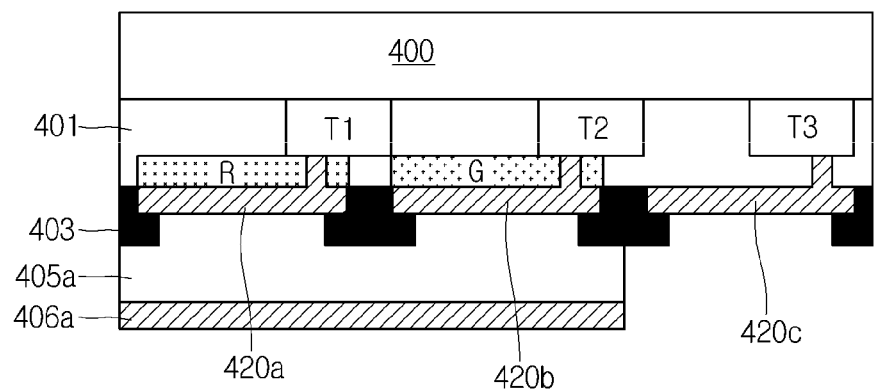
Figure 5D:
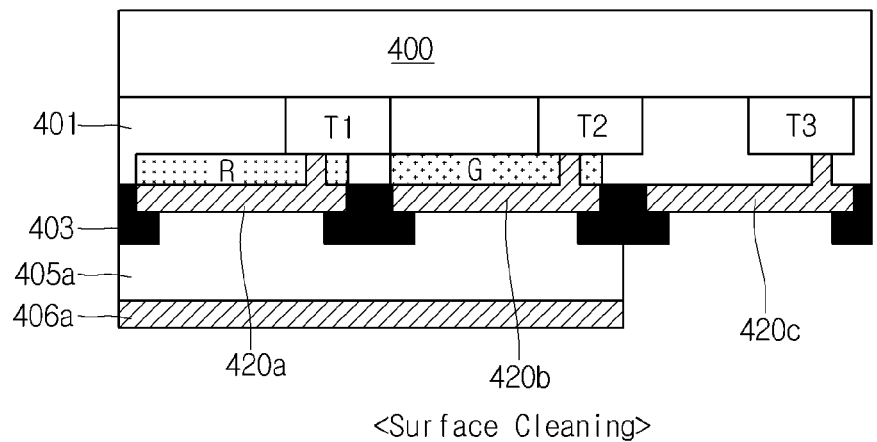
Figure 5E:
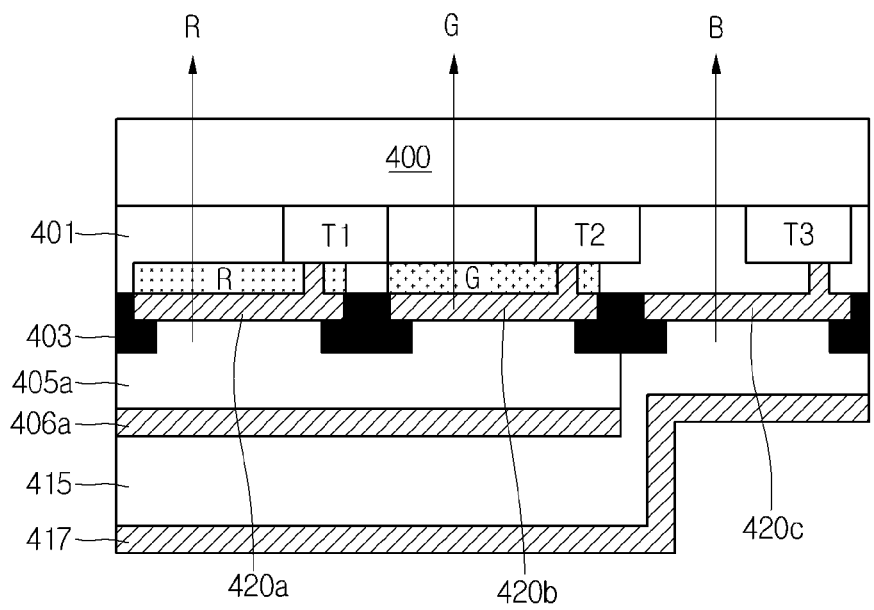

When the organic light emission layer pattern 405a and the first cathode 406a are formed on the substrate 400 as described above, a surface cleaning process is performed for the substrate 400 provided with the first cathode 406a, as shown in FIG. 5D. Continuously, a second organic light emission layer 415 is formed on the entire surface of the substrate 400 provided with the first cathode 406a, as shown in FIG. 5E. The second organic light emission layer 415 can be formed through one of the coating process and the deposition process, like the first organic light emission layer 405. However, the second organic light emission layer 415 is formed from another organic material capable of emitting blue light, unlike the first organic light emission layer 405.

Afterward, a second cathode 417 is formed on the second organic light emission layer 415 by depositing a metal layer on the entire surface of the substrate 400. The second cathode 417 can be formed from an opaque metal with high reflectance.

The organic electroluminescent display device of the fourth embodiment is described as having a structure of emitting light toward the rear surface of the substrate 400. However, the organic electroluminescent display device of the fourth embodiment can emit light toward the cathodes. In this case, the first through third anodes 420a through 420c are formed from one of magnesium Mg, calcium Ca, aluminum Al, silver Ag, lithium Li and alloys thereof, and the first and second cathodes 406a and 417 are formed from a transparent conductive material such as indium-tin-oxide ITO, indium-zinc-oxide IZO or aluminum-zinc-oxide AZO.

In this way, the fourth embodiment allows the red and green color filter layers R and G, the organic light emission layer pattern 405a emitting a mixture of red light and green light, and the first cathode 406a to be sequentially formed only on the red and green sub-pixel regions. Meanwhile, the second organic light emission layer 415 emitting blue light and the second cathode 417 are sequentially formed in the blue sub-pixel region without forming any color filter layer. As such, a process of forming a blue color filter layer can be omitted.

Also, the first and second organic light emission layers 405 and 417 can be formed through the coating process or the deposition process without using any shadow mask. As such, the organic electroluminescent display device of the fourth embodiment can prevent the previous problems which had been generated in that of the related art due to the use of the shadow mask.

Moreover, the mixture of red light and green light generated in the organic light emission layer pattern 405a is applied to the red and green color filter layers R and G. As such, red light and green light can be output from the red and green sub-pixel, respectively. Meanwhile, the blue sub-pixel allows blue light generated in the second organic light emission layer 415 to be output. Therefore, the organic electroluminescent display device of the fourth embodiment can display a color image.

FIGS. 6A through 6E are cross-sectional views illustrating a method of fabricating an organic electroluminescent display device according to a fifth embodiment of the present disclosure.

The description of the fifth embodiment will be focused on components distinguished from those of the fourth embodiment. Also, it will be easily understood to an ordinary person explanation regarding the other components of the fifth embodiment, which will be not explained in detail, upon the above-mentioned description of the fourth embodiment.

Referring to FIGS. 6A through 6E, a substrate 400 is prepared. Although they are not shown in the drawings, a plurality of gate lines and a plurality of data lines crossing each other are formed on the substrate 400 in such a manner as to define a plurality of sub-pixel regions.

As shown in the drawings, first through third switching elements T1 through T3, are formed on the red, green and blue sub-pixel regions of the substrate 400, respectively. Also, a passivation layer 401 and a bank pattern 403 are sequentially formed on the substrate 400 provided with the first through third switching elements T1 through T3.

When the bank pattern 403 is formed on the substrate 400 as described above, red and green color filter layers R and G are formed in exposed regions of the passivation layer 401 corresponding to the red and green sub-pixel regions, respectively. Also, first through third anodes 420a through 420c are formed in the red, green and blue sub-pixel regions R, G and B of the first substrate 400 in such a manner as to be connected to drain electrodes of the first through third switching elements T1 through T3, respectively. Subsequently, a first organic light emission layer 405 is formed on the entire surface of the substrate 400 through one of a coating process and a deposition process. Thereafter, a first cathode 406a is formed on the first organic light emission layer 405 opposite to the red and green sub-pixels using an electrode film which is configured with a base substrate 450, a transmission layer 452, an adhesive layer 453 and a metal layer.

The transmission layer 452 of the electrode film has a property of being separate from the metal layer when ultraviolet rays are irradiated. Also, the transmission layer 452 is formed on the base substrate 450 opposite to the red and green sub-pixel regions. Meanwhile, the adhesive layer 453 is formed in the same layer as the transmission layer 452 and on the base substrate 450 opposite to the blue sub-pixel region.

In order to form the first cathode 406a, the ultraviolet rays are irradiated to the entire surface of the electrode film which brings into contact with the first organic light emission layer 405. At this time, a part of the metal layer opposite to the transmission layer 452 is separated from the electrode film and attached to the first organic light emission layer 405, thereby forming the first cathode 406a. Meanwhile, the metal layer opposite to the adhesive layer 453 cannot be separated from the electrode film. In other words, the metal layer opposite to the adhesive layer 453 remains in the electrode film as a sacrificial layer 456.

The first cathode 406a can be formed from an opaque metal with high reflectance. For example, the first cathode 406a can be formed from one of magnesium Mg, calcium Ca, aluminum Al, silver Ag, lithium Li and alloys thereof.

After the formation of the first cathode 406a, the laser irradiation process is performed for the exposed portion of the first organic light emission layer 405 corresponding to the blue sub-pixel region, in order to remove the exposed portion of the first organic light emission layer 405. In accordance therewith, an organic light emission layer pattern 405a is derived from the first organic light emission layer 405. The organic light emission layer 405 can be formed from an organic material capable of emitting a mixture of red light and green light. The organic light emission layer pattern 405a is formed only in the red and green sub-pixel regions.

Figure 6A:
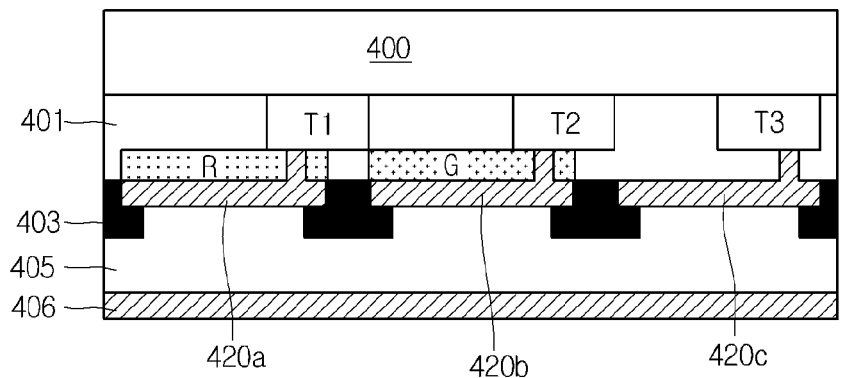
FIGS. 6A through 6E are cross-sectional views illustrating a method of fabricating an organic electroluminescent display device according to a fifth embodiment of the present disclosure.
Figure 6B:
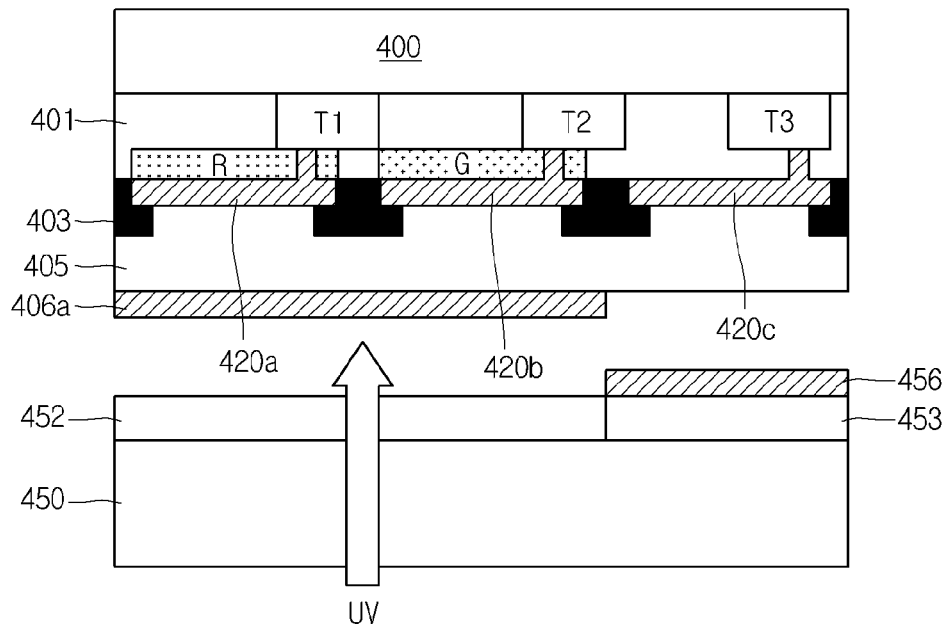
Figure 6C:
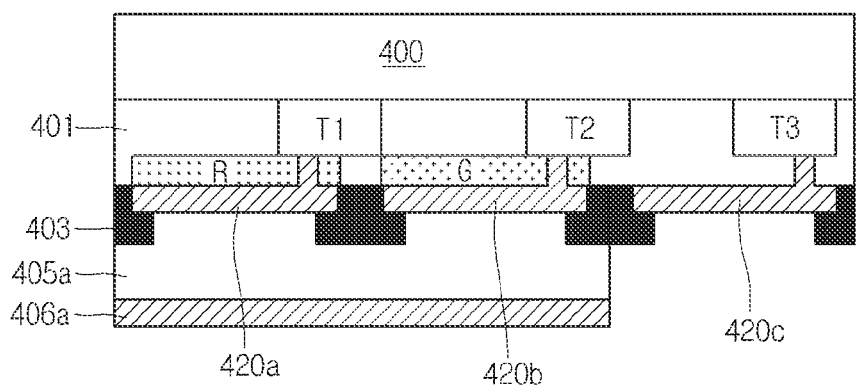
Figure 6D:
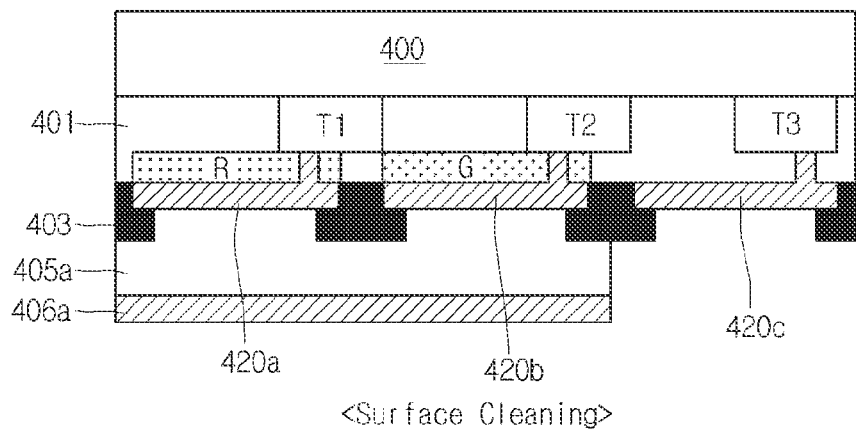
Figure 6E:
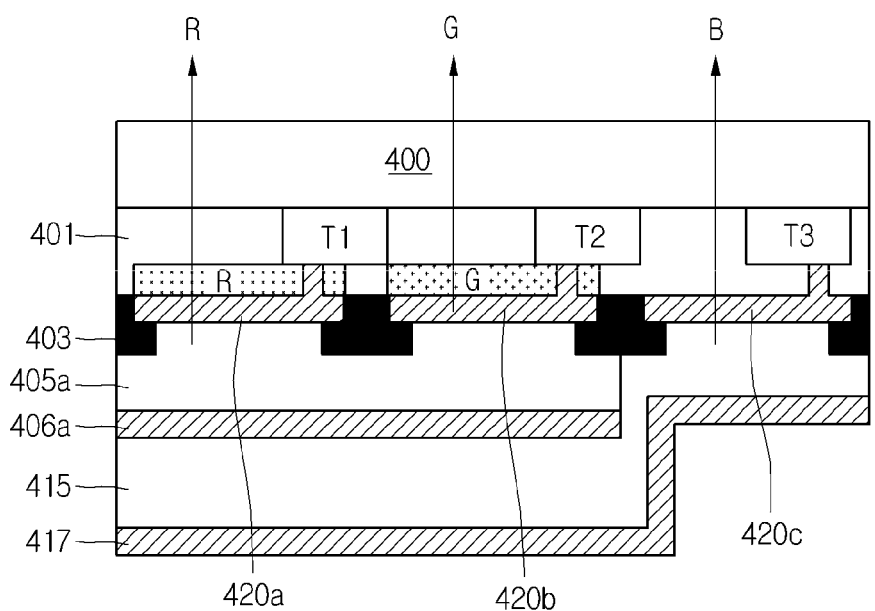

When the organic light emission layer pattern 405a and the first cathode 406a are formed on the substrate 400 as described above, a surface cleaning process is performed for the substrate 400 provided with the first cathode 406a, as shown in FIG. 6D. Subsequently, a second organic light emission layer 415 is formed on the entire surface of the substrate 400 provided with the first cathode 406a, as shown in FIG. 6E. The second organic light emission layer 415 can be formed through one of the coating process and the deposition process, like the first organic light emission layer 405. However, the second organic light emission layer 415 is formed from another organic material capable of emitting blue light, unlike the first organic light emission layer 405.

Afterward, a second cathode 417 is formed on the second organic light emission layer 415 by depositing a metal layer on the entire surface of the substrate 400. The second cathode 417 can be formed from an opaque metal with high reflectance.

In this way, the fifth embodiment allows the organic light emission layer pattern 405a emitting a mixture of red light and green light and the first cathode 406a to be sequentially formed only on the red and green sub-pixel regions. Meanwhile, the second organic light emission layer 415 emitting blue light and the second cathode 417 are sequentially formed in the blue sub-pixel region.

The organic electroluminescent display device of the fifth embodiment is described as having a structure of emitting light toward the rear surface of the substrate 400. However, the organic electroluminescent display device of the fifth embodiment can emit light toward the cathodes. In this case, the first through third anodes 420a through 420c are formed from one of magnesium Mg, calcium Ca, aluminum Al, silver Ag, lithium Li and alloys thereof, and the first and second cathodes 406a and 417 are formed from a transparent conductive material such as indium-tin-oxide ITO, indium-zinc-oxide IZO or aluminum-zinc-oxide AZO.

Particularly, the first and second organic light emission layers 405 and 417 can be formed on the substrate without using any shadow mask. As such, the organic electroluminescent display device of the fifth embodiment can prevent the previous problems which had been generated in that of the related art due to the use of the shadow mask.

Moreover, the mixture of red light and green light generated in the organic light emission layer pattern 405a is applied to the red and green color filter layers R and G. As such, red light and green light can be output from the red and green sub-pixel, respectively. Meanwhile, the blue sub-pixel allows blue light generated in the second organic light emission layer 415 to be output. Therefore, the organic electroluminescent display device of the fifth embodiment can display a color image.

FIGS. 7A through 7E are cross-sectional views illustrating a method of fabricating an organic electroluminescent display device according to a sixth embodiment of the present disclosure.

The description of the sixth embodiment will be focused on components distinguished from those of the fourth embodiment. Also, it will be easily understood to an ordinary person explanation regarding the other components of the sixth embodiment, which will be not explained in detail, upon the above-mentioned descriptions of the fourth and fifth embodiments.

As shown in FIGS. 7A through 7E, first through third switching elements T1 through T3, a passivation layer 401, a bank pattern 403, red and green color filter layers R and G, and first through third anodes 420a through 420c are sequentially formed on a substrate 400.

In the sixth embodiment of the present disclosure, a photo resist pattern 470 is formed on the third anode 420c of the blue sub-pixel. The photo resist pattern 470 can be prepared by forming a photo resist film on the entire surface of the above-mentioned substrate 400 and performing exposure and development processes for the photo resist film.

Figure 7A:
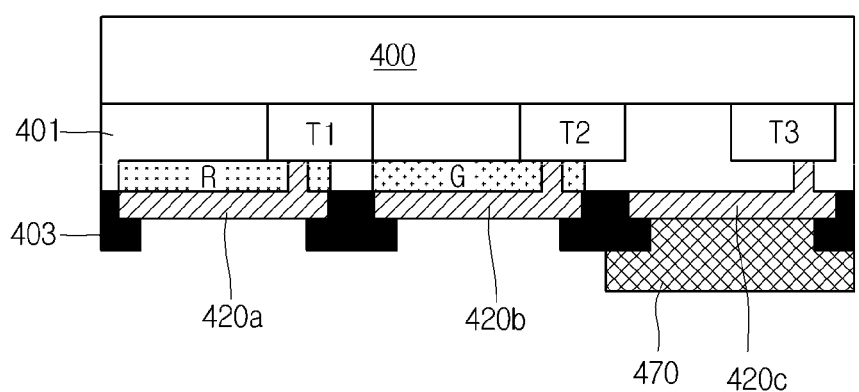
FIGS. 7A through 7E are cross-sectional views illustrating a method of fabricating an organic electroluminescent display device according to a sixth embodiment of the present disclosure.
Figure 7B:
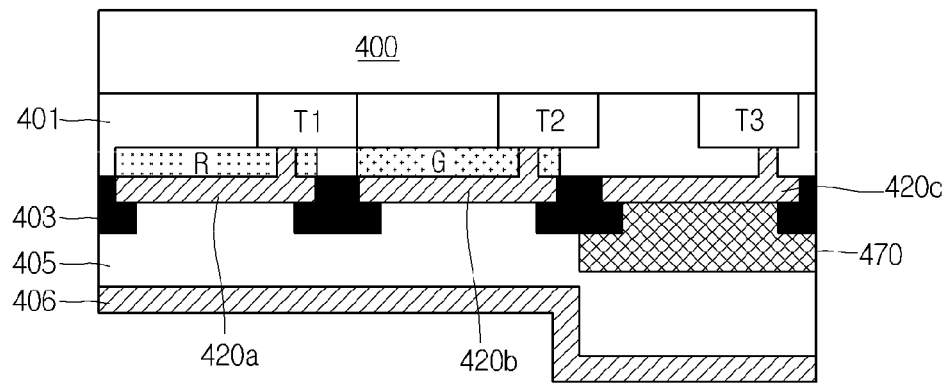

Subsequently, a first organic light emission layer 405 is formed on the entire surface of the substrate 400 provided with the photo resist pattern 470, as shown in FIG. 7B. Also, a metal layer 406 is formed on the first organic light emission layer 405.

Figure 7C:
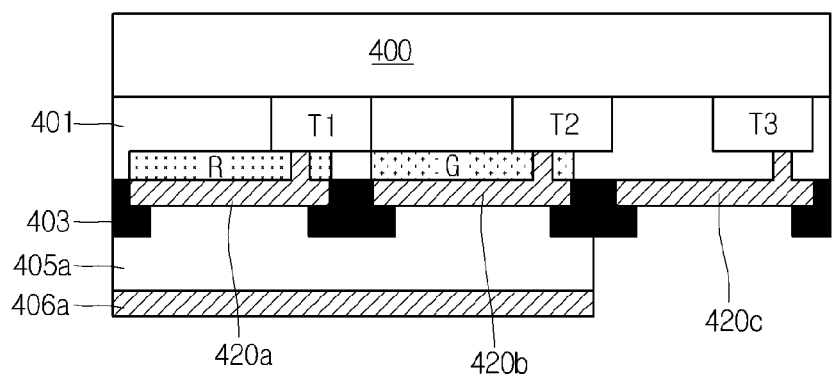
Figure 7D:
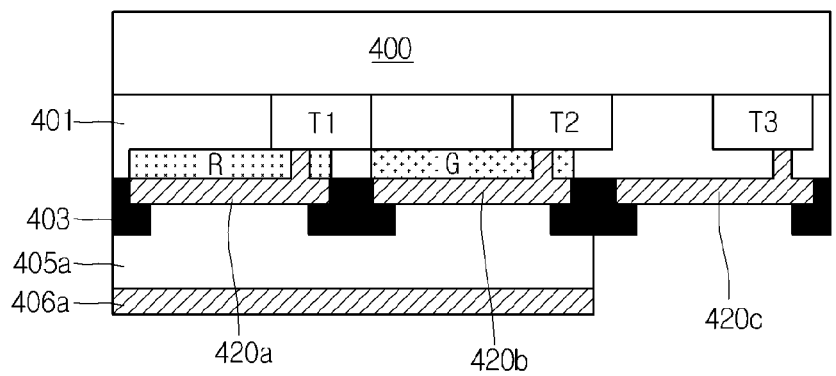
Figure 7E:
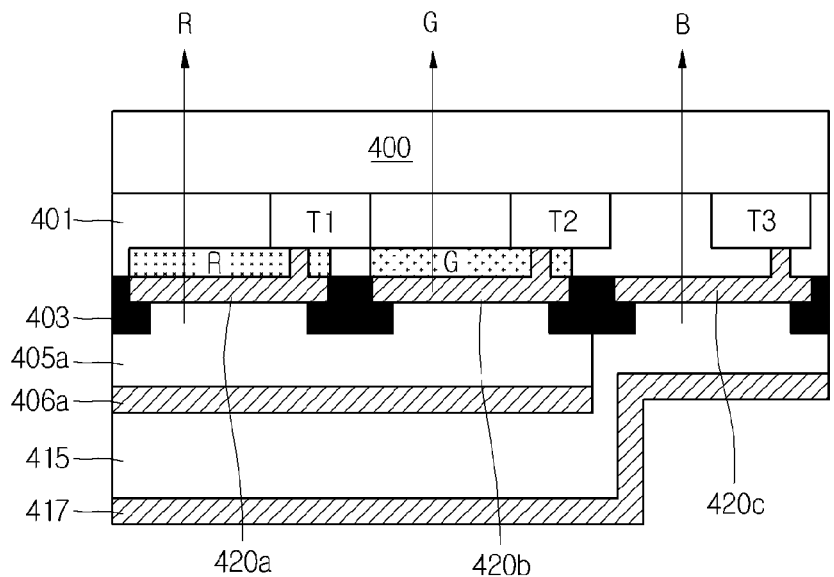

Thereafter, the photo resist pattern 470 is removed through a lift-off process which uses stripper solution. At the same time, the first organic light emission layer 405 and the metal layer 406, which are formed on the photo resist pattern 470, are also removed. In accordance therewith, an organic light emission layer pattern 405a and a first cathode 406a are derived from the first organic light emission layer 405 and the metal layer 406, respectively, as shown in FIG. 7C.

The first cathode 406a can be formed from an opaque metal with high reflectance. For example, the first cathode 406a can be formed from one of magnesium Mg, calcium Ca, aluminum Al, silver Ag, lithium Li and alloys thereof.

When the first cathode 406a is formed on the substrate 400 as described above, a surface cleaning process is performed for the substrate 400 provided with the first cathode 406a, as shown in FIG. 5D. Continuously, a second organic light emission layer 415 is formed on the entire surface of the substrate 400 provided with the first cathode 406a, as shown in FIG. 5E. The second organic light emission layer 415 can be formed through one of the coating process and the deposition process, like the first organic light emission layer 405. However, the second organic light emission layer 415 is formed from another organic material capable of emitting blue light, unlike the first organic light emission layer 405.

Afterward, a second cathode 417 is formed on the second organic light emission layer 415 by depositing a metal layer on the entire surface of the substrate 400. The second cathode 417 can be formed from an opaque metal with high reflectance.

The organic electroluminescent display device of the sixth embodiment is described as having a structure of emitting light toward the rear surface of the substrate 400. However, the organic electroluminescent display device of the fourth embodiment can emit light toward the cathodes. In this case, the first through third anodes 420a through 420c are formed from one of magnesium Mg, calcium Ca, aluminum Al, silver Ag, lithium Li and alloys thereof, and the first and second cathodes 406a and 417 are formed from a transparent conductive material such as indium-tin-oxide ITO, indium-zinc-oxide IZO or aluminum-zinc-oxide AZO.

Such a sixth embodiment allows the organic light emission layer pattern 405a emitting a mixture of red light and green light and the first cathode 406a to be sequentially formed in the red and green sub-pixel regions. Also, the sixth embodiment enables the second organic light emission layer 415 emitting blue light and the second cathode 417 to be sequentially formed in the blue sub-pixel region.

Also, the first and second organic light emission layers 405 and 417 can be formed through the coating process or the deposition process without using any shadow mask. As such, the organic electroluminescent display device of the sixth embodiment can prevent the previous problems which had been generated in that of the related art due to the use of the shadow mask.

Moreover, the mixture of red light and green light generated in the organic light emission layer pattern 405a is applied to the red and green color filter layers R and G. As such, red light and green light can be output from the red and green sub-pixel, respectively. Meanwhile, the blue sub-pixel allows blue light generated in the second organic light emission layer 415 to be output. Therefore, the organic electroluminescent display device of the sixth embodiment can display a color image.

Figure 8:
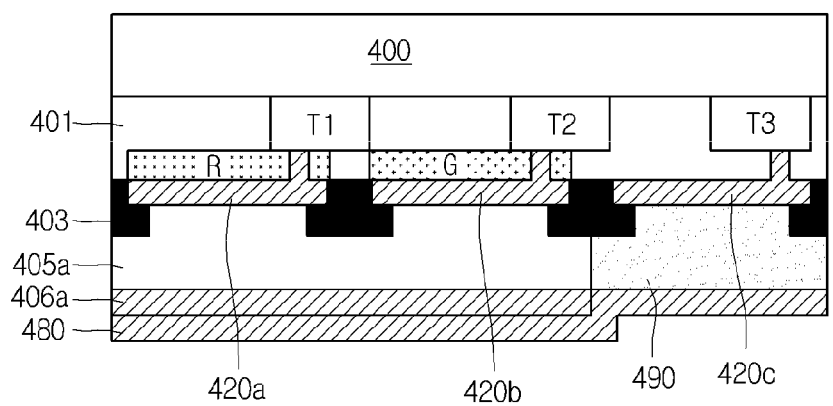
FIG. 8 is a cross-sectional view illustrating a method of fabricating an organic electroluminescent display device according to a seventh embodiment of the present disclosure.

FIG. 8 is a cross-sectional view illustrating a method of fabricating an organic electroluminescent display device according to a seventh embodiment of the present disclosure.

The seventh embodiment corresponds to a modification of the fourth embodiment. As such, the description of the seventh embodiment will be focused on components distinguished from those of the fourth embodiment. Also, it will be easily understood to an ordinary person explanation regarding the other components of the seventh embodiment, which will be not explained in detail, upon the above-mentioned description of the fourth embodiment.

Referring to FIG. 8, the seventh embodiment allows the processes of the fourth embodiment, which are shown in FIGS. 5A through 5C and include the formation processes of the organic light emission layer pattern 405a and the first cathode 406a, to be sequentially performed for a substrate 400. Subsequently, a surface cleaning process is performed for the substrate 400 provided with the organic light emission layer pattern 405a and the first cathode 406a.

Thereafter, a second organic light emission layer 490 is formed on the third anode 420c within the blue sub-pixel region using one of an organic vapor jet printing method, a nozzle-jet printing method and an ink-jet printing method.

The second organic light emission layer 490 on the third anode 420c within the blue sub-pixel region can be formed from an organic material capable of emitting blue light and in the same layer as the organic light emission layer pattern 405a. The second organic light emission layer 490 is formed to have the same height as the organic light emission layer pattern 405a.

When the second organic light emission layer 490 is formed on the substrate 400 as described above, a second cathode 480 is formed on the first cathode 106a and the second organic light emission layer 490 by depositing a metal material on the entire surface of the substrate 400. The second cathode 480 can be formed from an opaque metal with high reflectance. Also, the second cathode 480 comes into direct contact with the first cathode 406a.

The organic electroluminescent display device of the seventh embodiment is described as having a structure of emitting light toward the rear surface of the substrate 400. However, the organic electroluminescent display device of the seventh embodiment can emit light toward the cathodes. In this case, the first through third anodes 420a through 420c are formed from one of magnesium Mg, calcium Ca, aluminum Al, silver Ag, lithium Li and alloys thereof, and the first and second cathodes 406a and 480 are formed from a transparent conductive material such as indium-tin-oxide ITO, indium-zinc-oxide IZO or aluminum-zinc-oxide AZO.

In the organic electroluminescent display device of the seventh embodiment, the second organic light emission layer 490 is formed in the same layer as the organic light emission layer pattern 405a.

Also, both the first and second organic light emission layers 405 and 490 can be formed without using any shadow mask. As such, the organic electroluminescent display device of the seventh embodiment can prevent the previous problems which had been generated in that of the related art due to the use of the shadow mask.

Moreover, the mixture of red light and green light generated in the organic light emission layer pattern 405a is applied to the red and green color filter layers R and G. As such, red light and green light can be output from the red and green sub-pixel, respectively. Meanwhile, the blue sub-pixel allows blue light generated in the second organic light emission layer 415 to be output. Therefore, the organic electroluminescent display device of the seventh embodiment can display a color image.

FIGS. 9A through 9F are cross-sectional views illustrating a method of fabricating an organic electroluminescent display device according to an eighth embodiment of the present disclosure.

Referring to FIGS. 9A through 9F, a substrate 500 is prepared. Although they are not shown in the drawings, a plurality of gate lines and a plurality of data lines crossing each other are formed on the substrate 500 in such a manner as to define a plurality of sub-pixel regions.

The sub-pixel regions are classified into red, green and blue sub-pixel regions. Also, thin film transistors TFT being used as switching elements are formed in the red and green sub-pixel regions.

As shown in the drawings, first through third switching elements T1 through T3 are formed in the red, green and blue sub-pixel regions of the substrate 500, respectively. A passivation layer 501 is formed on the entire surface of the substrate 500 provided with the first through third switching elements T1 through T3.

Although the structure of each switching element T1 and T2 is not shown in the drawings, one of a top-gate thin-film transistor and a bottom-gate thin-film transistor, which are generally being used in the organic electroluminescent display devices, can be formed as a switching element.

After the above-mentioned passivation layer 501 is formed on the substrate 500, a bank pattern 503 used to define sub-pixels is formed on the passivation layer 501. The bank pattern 503 can be prepared by forming a metal film or an opaque resin layer on the entire surface of the substrate 500 and performing a masking process for the metal film or the opaque resin layer. The metal film can be from a metal material such as chromium Cr.

When the bank pattern 503 is formed on the substrate 500 as described above, a red color filter layer R and a green color filter layer G are formed in exposed regions of the passivation layer 501 corresponding to the red and green sub-pixel regions, respectively. Subsequently, a contact hole formation process is performed for the red and green color filter layers R and G and the bank pattern 503, in order to expose drain electrodes of the first through third switching elements T1 through T3.

Thereafter, first through third anodes 520a through 520c are formed in the red, green and blue sub-pixel regions R, G and B of the substrate 500. The first through third anodes 520a through 520c can be prepared by forming a metal film on the entire surface of the substrate 500 provided with the bank pattern 503 and the red and green color filter layers R and G and performing a masking process and an etch process for the metal film. The metal film can be formed from a transparent conductive material such as indium-tin-oxide ITO, indium-zinc-oxide IZO or aluminum-zinc-oxide AZO.

Subsequently, a hole support layer 504 is formed on the entire surface of the substrate 500 provided with the first through third anodes 520a through 520c using one of a coating procedure and a deposition process. Also, a first organic light emission layer 505 is formed on the hole support layer 504 corresponding to the red and green sub-pixel regions using a mask 650. The hole support layer 504 can include a hole injection layer HIL and a hole transport layer HTL. The first organic light emission layer 505 can be formed from an organic material capable of emitting a mixture of red light and green light.

Figure 9A:
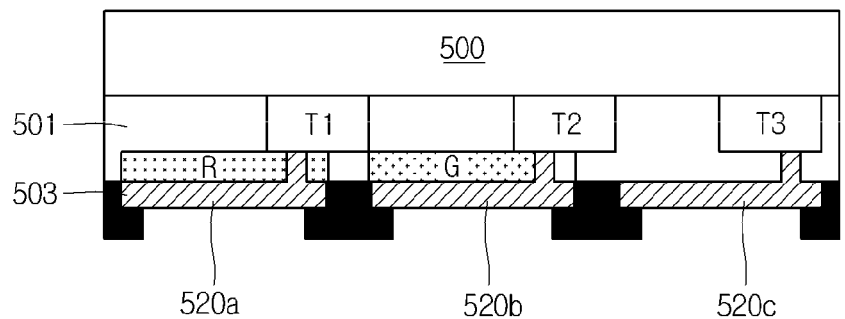
FIGS. 9A through 9F are cross-sectional views illustrating a method of fabricating an organic electroluminescent display device according to an eighth embodiment of the present disclosure.
Figure 9B:
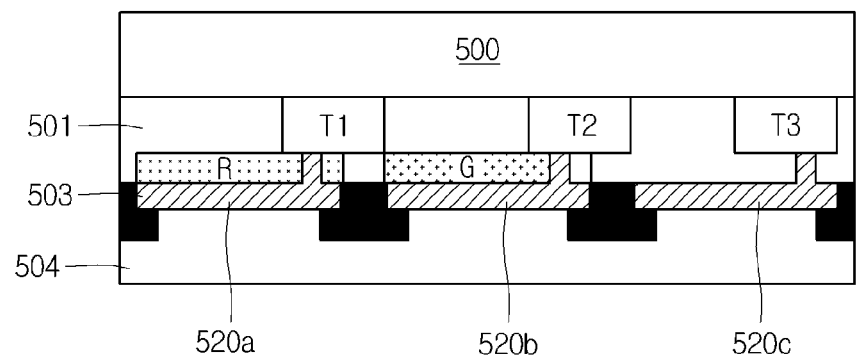
Figure 9C:
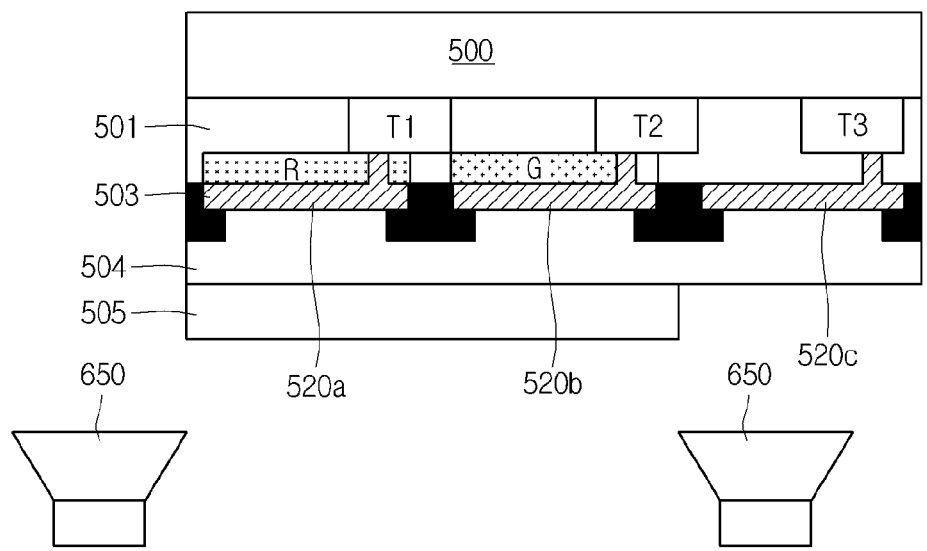
Figure 9D:
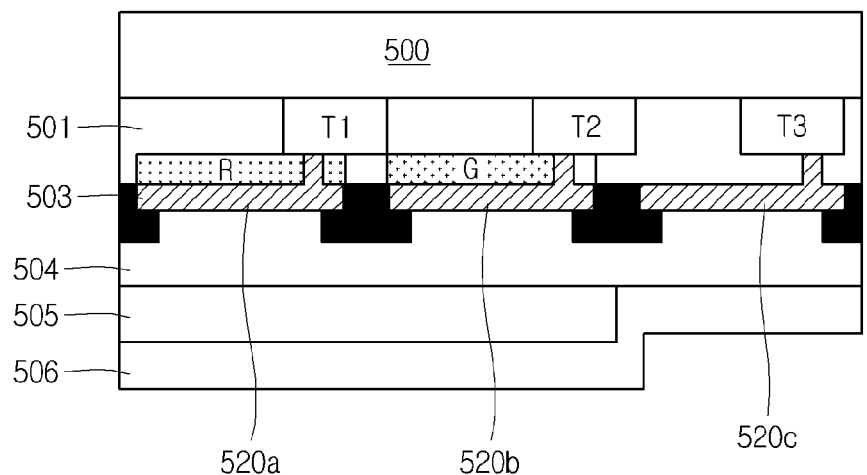

Afterward, a second organic light emission layer 506 is formed on the entire surface of the substrate 500 provided with the first organic light emission layer 505, as shown in FIG. 9D. The second organic light emission layer 506 can be formed through one of the coating process and the deposition process. Also, the second organic light emission layer 506 is formed from another organic material capable of emitting blue light, unlike the first organic light emission layer 505. Moreover, the second organic light emission layer 506 is formed to cover the entire surface of the substrate 500.

Figure 9E:
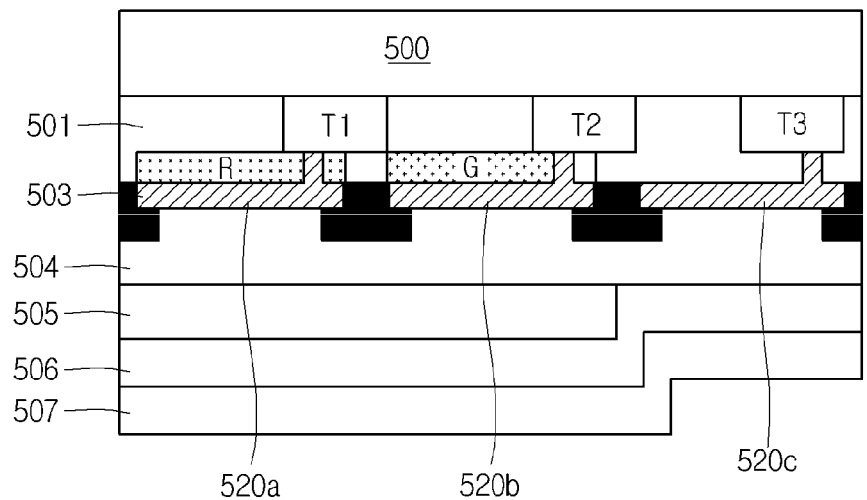

When the first and second organic light emission layers 505 and 506 are formed on the substrate 500 as described above, an electron support layer 507 is formed on the second organic light emission layer 506, as shown in FIG. 9E. The electron support layer 507 can include an electron injection layer EIL and an electron transport layer ETL.

Figure 9F:
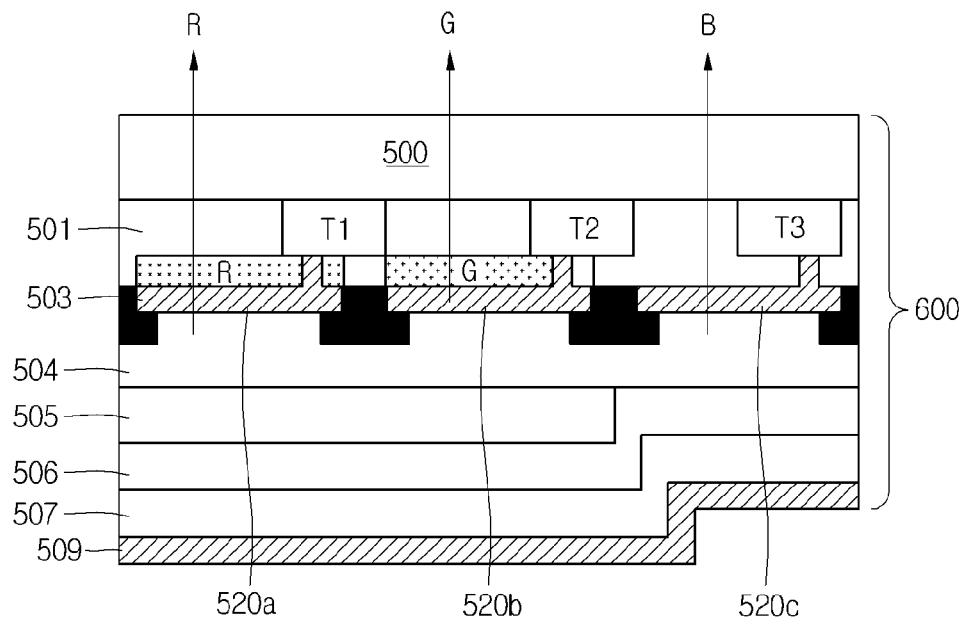

After the electron support layer 507 is formed on the substrate 500 as described above, a cathode 509 is formed on the electron support layer 507 by depositing a metal layer on the entire surface of the substrate 500, as shown in FIG. 9F. The cathode 509 can be formed from one of magnesium Mg, calcium Ca, aluminum Al, silver Ag, lithium Li and alloys thereof.

The organic electroluminescent display device of the eighth embodiment is described as having a structure of emitting light toward the rear surface of the substrate 500. However, the organic electroluminescent display device of the eighth embodiment can have another structure adapted to emit light toward the cathode. In this case, the first through third anodes 520a through 520c are formed from one of magnesium Mg, calcium Ca, aluminum Al, silver Ag, lithium Li and alloys thereof, and the cathode 509 is formed from a transparent conductive material such as indium-tin-oxide ITO, indium-zinc-oxide IZO or aluminum-zinc-oxide AZO.

In this way, the eighth embodiment allows the red and green color filter layers R and G and the first organic light emission layer 505 emitting a mixture of red light and green light to be sequentially formed only on the red and green sub-pixel regions. Meanwhile, the second organic light emission layer 506 emitting blue light is formed in the blue sub-pixel region without forming any color filter layer and without using any shadow mask. Therefore, the organic electroluminescent display device of the eighth embodiment can prevent the previous problems which had been generated in that of the related art due to the use of the shadow mask.

Moreover, in the red sub-pixel region, the mixture of red light and green light generated in the first organic light emission layer 505 is re-mixed with blue light generated in the second organic light emission layer 506. As such, the re-mixed light can pass through the red color filter layer R. Therefore, red light can be output from the red sub-pixel. Similarly to this, green light can be output from the green sub-pixel. Meanwhile, in the blue sub-pixel region, only blue light generated in the second organic light emission layer 506 can be output through the third anode 520c. As a result, the organic electroluminescent display device of the eighth embodiment can enable red, green and blue lights to be output from the red, green and blue sub-pixel, thereby displaying a color image.

FIGS. 10A through 10F are cross-sectional views illustrating a method of fabricating an organic electroluminescent display device according to a ninth embodiment of the present disclosure.

The description of the ninth embodiment will be focused on components of the ninth embodiment which are distinguished from those of the eighth embodiment will be mainly described. Also, it will be easily understood to an ordinary person explanation regarding the other components of the ninth embodiment, which will be not explained in detail, upon the above-mentioned description of the eighth embodiment.

Referring to FIGS. 10A through 10F, first through third switching elements T1 through T3, a passivation layer 501, a bank pattern 503, red and green color filter layers R and G, first through third anodes 520a through 520c within red, green and blue sub-pixel regions, and a hole support layer 504 are sequentially formed on a substrate 500, like those in the eight embodiment.

Subsequently, a first organic light emission layer 605 is formed on the hole support layer 504 using one of an ink-jet printing method and a nozzle-jet printing method. The first organic light emission layer 605 is formed on the hole support layer 504 corresponding to the red and green sub-pixel regions. The hole support layer 504 can include a hole injection layer HIL and a hole transport layer HTL. A reference number "750" in FIG. 10C indicates a dispenser which can be used as one of a nozzle and an ink-jet. The first organic light emission layer 505 can be formed from an organic material capable of emitting a mixture of red light and green light.

Figure 10A:
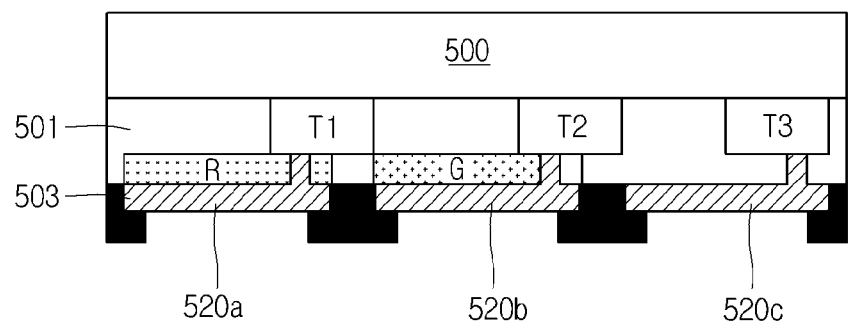
FIGS. 10A through 10F are cross-sectional views illustrating a method of fabricating an organic electroluminescent display device according to a ninth embodiment of the present disclosure.
Figure 10B:
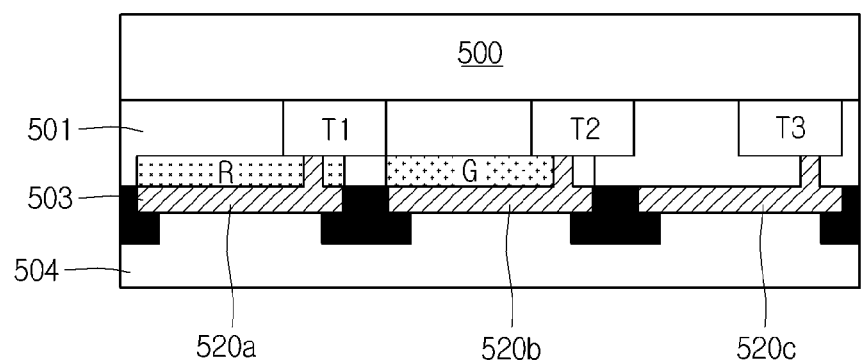
Figure 10C:
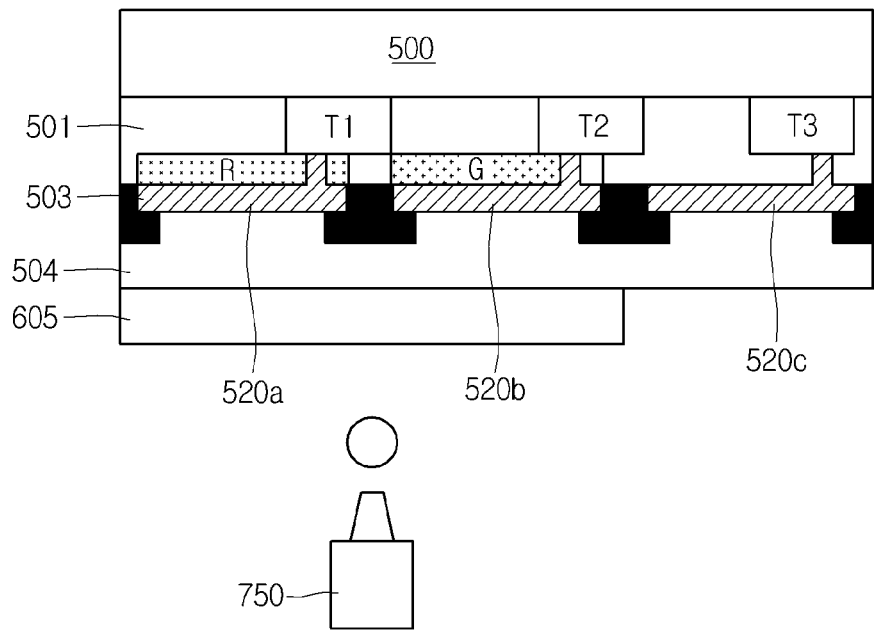
Figure 10D:
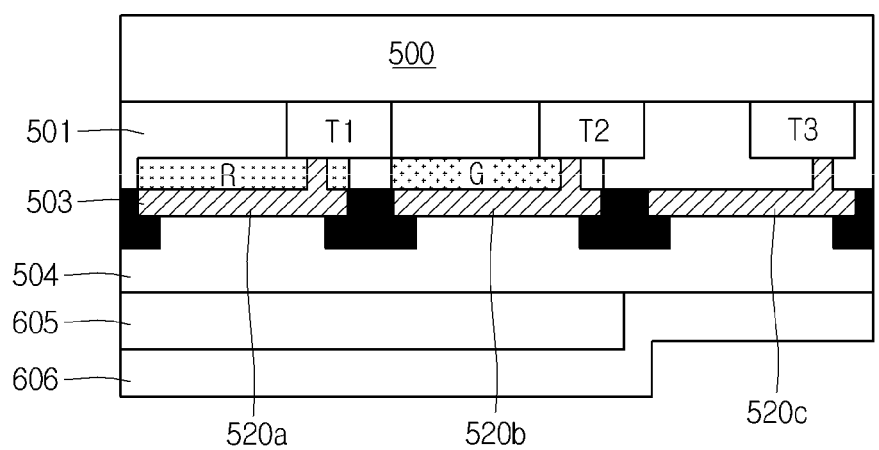

Afterward, a second organic light emission layer 606 is formed on the entire surface of the substrate 500 provided with the first organic light emission layer 605, as shown in FIG. 10D. The second organic light emission layer 606 can be formed through one of the coating process and the deposition process. Also, the second organic light emission layer 606 is formed from another organic material capable of emitting blue light, unlike the first organic light emission layer 605. Moreover, the second organic light emission layer 606 is formed to cover the entire surface of the substrate 500.

Figure 10E:
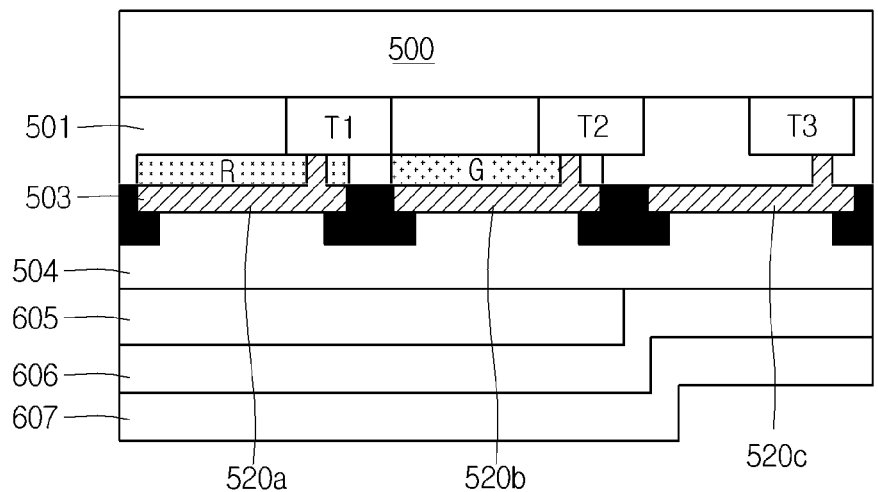

When the first and second organic light emission layers 605 and 606 are formed on the substrate 500 as described above, an electron support layer 607 is formed on the second organic light emission layer 606, as shown in FIG. 10E. The electron support layer 607 can include an electron injection layer EIL and an electron transport layer ETL.

Figure 10F:
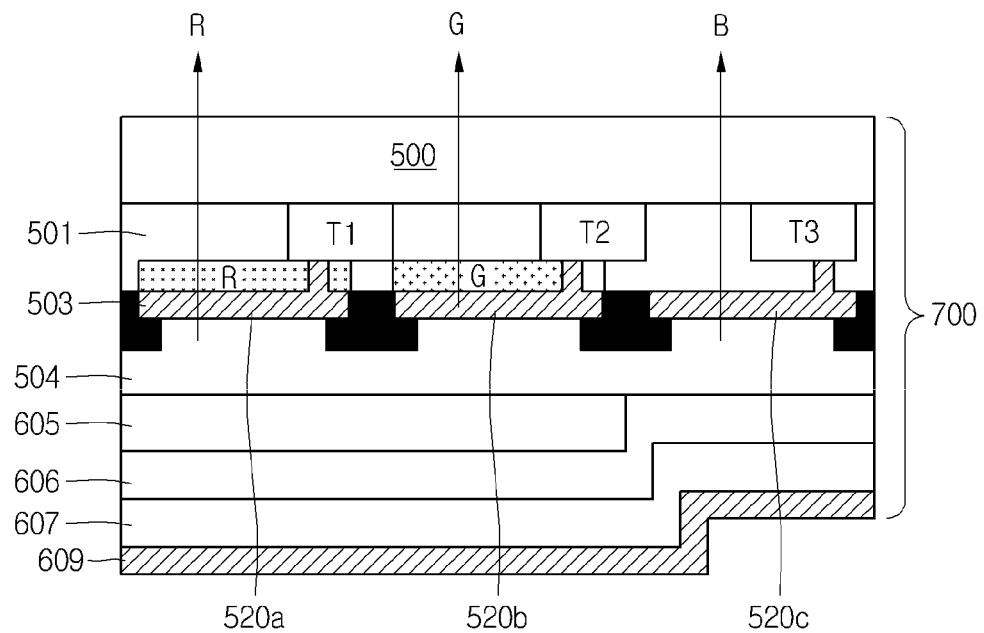

After the electron support layer 607 is formed on the substrate 500 as described above, a cathode 609 is formed on the electron support layer 607 by depositing a metal layer on the entire surface of the substrate 500, as shown in FIG. 10F. The cathode 609 can be formed from one of magnesium Mg, calcium Ca, aluminum Al, silver Ag, lithium Li and alloys thereof.

The organic electroluminescent display device of the ninth embodiment is described as having a structure of emitting light toward the rear surface of the substrate 500. However, the organic electroluminescent display device of the ninth embodiment can have another structure adapted to emit light toward the cathode. In this case, the first through third anodes 520a through 520c are formed from one of magnesium Mg, calcium Ca, aluminum Al, silver Ag, lithium Li and alloys thereof, and the cathode 609 is formed from a transparent conductive material such as indium-tin-oxide ITO, indium-zinc-oxide IZO or aluminum-zinc-oxide AZO.

In this way, the ninth embodiment allows the red and green color filter layers R and G and the first organic light emission layer 605 emitting a mixture of red light and green light to be sequentially formed only in the red and green sub-pixel regions. Meanwhile, the second organic light emission layer 606 emitting blue light is formed in the blue sub-pixel region without forming any color filter layer and without using any shadow mask. Therefore, the organic electroluminescent display device of the ninth embodiment can prevent the previous problems which had been generated in that of the related art due to the use of the shadow mask.

Moreover, in the red sub-pixel region, the mixture of red light and green light generated in the first organic light emission layer 605 is re-mixed with blue light generated in the second organic light emission layer 606. As such, the re-mixed light can pass through the red color filter layer R. Therefore, red light can be output from the red sub-pixel. Similarly to this, green light can be output from the green sub-pixel. Meanwhile, in the blue sub-pixel region, only blue light generated in the second organic light emission layer 606 can be output through the third anode 520c. As a result, the organic electroluminescent display device of the eighth embodiment can enable red, green and blue lights to be output from the red, green and blue sub-pixel, thereby displaying a color image.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

What is claimed is:

1. An organic electroluminescent display device comprising:
   a lower substrate including a first substrate defined into red, green and blue sub-pixel regions, first and second switching elements formed in the red and green sub-pixel regions, first and second anodes each connected to the first and second switching elements, and a first organic light emission layer entirely formed on the first substrate provided with the first and second anodes; and
   an upper substrate including a second substrate, red and green color filter layers formed on the second substrate corresponding to the red and green sub-pixel regions, a third switching element formed on the second substrate corresponding to the blue sub-pixel region, a third anode connected to the third switching element, and a second organic light emission layer entirely formed on the second substrate provided with the red and green color filter layers and the third anode.

2. The organic electroluminescent display device of claim 1, wherein the first organic light emission layer is formed from an organic material adapted to generate a mixture of red light and green light.

3. The organic electroluminescent display device of claim 1, wherein the second organic light emission layer is formed from an organic material adapted to generate blue light.

4. The organic electroluminescent display device of claim 1, wherein the first and second anodes on the lower substrate are formed from one of magnesium Mg, calcium Ca, aluminum Al, silver Ag, lithium Li and alloys thereof.

5. The organic electroluminescent display device of claim 1, wherein the third anode on the upper substrate is formed from a transparent conductive material such as one of indium-tin-oxide ITO, indium-zinc-oxide IZO and aluminum-zinc-oxide AZO.

6. The organic electroluminescent display device of claim 1, wherein the lower substrate includes a first cathode formed on the first organic light emission layer.

7. The organic electroluminescent display device of claim 1, wherein the upper substrate includes a second cathode formed on the second organic light emission layer corresponding to the blue sub-pixel region.

8. The organic electroluminescent display device of claim 1, wherein the upper substrate includes a second cathode entirely formed on the second organic light emission layer.

9. The organic electroluminescent display device of claim 8, further comprising a reflective plate formed on lower substrate corresponding to the blue sub-pixel region.

\* \* \* \* \*